US007561478B2

(12) United States Patent
Kumagai et al.

(10) Patent No.: US 7,561,478 B2
(45) Date of Patent: Jul. 14, 2009

(54) INTEGRATED CIRCUIT DEVICE AND ELECTRONIC INSTRUMENT

(75) Inventors: Takashi Kumagai, Chino (JP); Hisanobu Ishiyama, Chino (JP); Kazuhiro Maekawa, Chino (JP); Satoru Ito, Suwa (JP); Takashi Fujise, Shiojiri (JP); Junichi Karasawa, Nagano-ken (JP); Satoru Kodaira, Chino (JP); Katsuhiko Maki, Chino (JP)

(73) Assignee: Seiko Epson Corporation, Tokyo (JP)

( * ) Notice: Subject to any disclaimer, the term of this patent is extended or adjusted under 35 U.S.C. 154(b) by 592 days.

(21) Appl. No.: 11/270,632

(22) Filed: Nov. 10, 2005

(65) Prior Publication Data

US 2007/0001973 A1 Jan. 4, 2007

(30) Foreign Application Priority Data

Jun. 30, 2005 (JP) ............................ 2005-192478

(51) Int. Cl.
*G11C 5/14* (2006.01)

(52) U.S. Cl. ............................ 365/189.09; 365/230.03; 365/210.12; 365/230.06

(58) Field of Classification Search ............ 365/189.09, 365/230.03, 210.12, 230.06
See application file for complete search history.

(56) References Cited

U.S. PATENT DOCUMENTS 4,472,638 A 9/1984 Nishizawa et al.
4,566,038 A 1/1986 Dimick
4,648,077 A 3/1987 Pinkham et al.
4,975,753 A 12/1990 Ema
5,040,152 A 8/1991 Voss et al.
5,058,058 A 10/1991 Yasuda et al.
5,233,420 A 8/1993 Piri et al.
5,325,338 A 6/1994 Runaldue et al.
5,426,603 A 6/1995 Nakamura et al.
5,490,114 A 2/1996 Butler et al.
5,544,306 A 8/1996 Deering et al.
5,598,346 A 1/1997 Agrawal et al.

(Continued)

FOREIGN PATENT DOCUMENTS

CN 1534560 10/2004

(Continued)

OTHER PUBLICATIONS

U.S. Appl. No. 12/000,882, filed Dec. 18, 2007 in the name of Kodaira et al.

(Continued)

*Primary Examiner*—Thong Q Le
(74) *Attorney, Agent, or Firm*—Oliff & Berridge, PLC

(57) ABSTRACT

An integrated circuit device including first to Nth circuit blocks CB1 to CBN disposed along a first direction D1, when the first direction D1 is a direction from a first side of the integrated circuit device toward a third side which is opposite to the first side, the first side being a short side, and when a second direction D2 is a direction from a second side of the integrated circuit device toward a fourth side which is opposite to the second side, the second side being a long side. The circuit blocks CB1 to CBN include a logic circuit block LB, a grayscale voltage generation circuit block GB, data driver blocks DB1 to DB4, and a power supply circuit block PB. The data driver blocks DB1 to DB4 are disposed between the logic circuit block LB and the grayscale voltage generation circuit block GB, and the power supply circuit block PB.

20 Claims, 24 Drawing Sheets

U.S. PATENT DOCUMENTS

| | | | |
|---|---|---|---|
| 5,659,514 | A | 8/1997 | Hazani |
| 5,701,269 | A | 12/1997 | Fujii |
| 5,739,803 | A | 4/1998 | Neugebauer |
| 5,767,865 | A | 6/1998 | Inoue et al. |
| 5,815,136 | A | 9/1998 | Ikeda et al. |
| 5,860,084 | A | 1/1999 | Yaguchi |
| RE36,089 | E | 2/1999 | Ooishi et al. |
| 5,909,125 | A | 6/1999 | Kean |
| 5,917,770 | A | 6/1999 | Tanaka |
| 5,920,885 | A | 7/1999 | Rao |
| 5,933,364 | A | 8/1999 | Aoyama et al. |
| 6,005,296 | A | 12/1999 | Chan |
| 6,025,822 | A | 2/2000 | Motegi et al. |
| 6,034,541 | A | 3/2000 | Kopec, Jr. et al. |
| 6,111,786 | A | 8/2000 | Nakamura |
| 6,118,425 | A | 9/2000 | Kudo et al. |
| 6,140,983 | A | 10/2000 | Quanrud |
| 6,225,990 | B1 | 5/2001 | Aoki et al. |
| 6,229,336 | B1 | 5/2001 | Felton et al. |
| 6,229,753 | B1 | 5/2001 | Kono et al. |
| 6,246,386 | B1 | 6/2001 | Perner |
| 6,259,459 | B1 | 7/2001 | Middleton |
| 6,278,148 | B1 | 8/2001 | Watanabe et al. |
| 6,324,088 | B1 | 11/2001 | Keeth et al. |
| 6,339,417 | B1 | 1/2002 | Quanrud |
| 6,421,286 | B1 | 7/2002 | Ohtani et al. |
| 6,559,508 | B1 | 5/2003 | Lin et al. |
| 6,580,631 | B1 | 6/2003 | Keeth et al. |
| 6,611,407 | B1 | 8/2003 | Chang |
| 6,646,283 | B1 | 11/2003 | Akimoto et al. |
| 6,724,378 | B2 | 4/2004 | Tamura et al. |
| 6,731,538 | B2 | 5/2004 | Noda et al. |
| 6,822,631 | B1 | 11/2004 | Yatabe |
| 6,826,116 | B2 | 11/2004 | Noda et al. |
| 6,862,247 | B2 | 3/2005 | Yamazaki |
| 6,873,310 | B2 | 3/2005 | Matsueda |
| 6,873,566 | B2 | 3/2005 | Choi |
| 6,999,353 | B2 | 2/2006 | Noda et al. |
| 7,078,948 | B2 | 7/2006 | Dosho |
| 7,081,879 | B2 | 7/2006 | Sun et al. |
| 7,142,221 | B2 | 11/2006 | Sakamaki et al. |
| 7,158,439 | B2 | 1/2007 | Shionori et al. |
| 7,164,415 | B2 | 1/2007 | Ooishi et al. |
| 7,176,864 | B2 | 2/2007 | Moriyama et al. |
| 7,180,495 | B1 | 2/2007 | Matsueda |
| 7,280,329 | B2 | 10/2007 | Kim et al. |
| 7,330,163 | B2 | 2/2008 | Nakai et al. |
| 7,391,668 | B2 | 6/2008 | Natori et al. |
| 2001/0022744 | A1 | 9/2001 | Noda et al. |
| 2002/0011998 | A1 | 1/2002 | Tamura |
| 2002/0018058 | A1 | 2/2002 | Tamura |
| 2002/0113783 | A1 | 8/2002 | Tamura et al. |
| 2002/0126108 | A1 | 9/2002 | Koyama et al. |
| 2002/0154557 | A1 | 10/2002 | Mizugaki et al. |
| 2003/0034948 | A1 | 2/2003 | Imamura |
| 2003/0053022 | A1 | 3/2003 | Kaneko et al. |
| 2003/0053321 | A1 | 3/2003 | Ishiyama |
| 2003/0169244 | A1 | 9/2003 | Kurokawa et al. |
| 2004/0004877 | A1 | 1/2004 | Uetake |
| 2004/0017341 | A1* | 1/2004 | Maki .......................... 345/87 |
| 2004/0021947 | A1 | 2/2004 | Schofield et al. |
| 2004/0124472 | A1 | 7/2004 | Lin et al. |
| 2004/0140970 | A1* | 7/2004 | Morita ...................... 345/204 |
| 2004/0239606 | A1 | 12/2004 | Ota |
| 2005/0001846 | A1 | 1/2005 | Shiono |
| 2005/0045955 | A1 | 3/2005 | Kim et al. |
| 2005/0047266 | A1 | 3/2005 | Shionori et al. |
| 2005/0052340 | A1 | 3/2005 | Goto et al. |
| 2005/0057581 | A1 | 3/2005 | Horiuchi et al. |
| 2005/0073470 | A1* | 4/2005 | Nose et al. .................. 345/1.1 |
| 2005/0122303 | A1* | 6/2005 | Hashimoto .................. 345/98 |
| 2005/0195149 | A1* | 9/2005 | Ito ............................. 345/98 |
| 2005/0212788 | A1 | 9/2005 | Fukuda et al. |
| 2005/0212826 | A1 | 9/2005 | Fukuda et al. |
| 2005/0219189 | A1* | 10/2005 | Fukuo ........................ 345/96 |
| 2005/0253976 | A1 | 11/2005 | Sekiguchi et al. |
| 2005/0262293 | A1 | 11/2005 | Yoon |
| 2005/0285862 | A1 | 12/2005 | Noda et al. |
| 2006/0028417 | A1 | 2/2006 | Harada et al. |
| 2006/0050042 | A1 | 3/2006 | Yi |
| 2006/0062483 | A1 | 3/2006 | Kondo et al. |
| 2007/0000971 | A1 | 1/2007 | Kumagai et al. |
| 2007/0001886 | A1 | 1/2007 | Ito et al. |
| 2007/0001968 | A1 | 1/2007 | Kodaira et al. |
| 2007/0001969 | A1 | 1/2007 | Kodaira et al. |
| 2007/0001970 | A1 | 1/2007 | Kodaira et al. |
| 2007/0001971 | A1 | 1/2007 | Kumagai et al. |
| 2007/0001972 | A1 | 1/2007 | Kumagai et al. |
| 2007/0001974 | A1 | 1/2007 | Kumagai et al. |
| 2007/0001975 | A1 | 1/2007 | Kumagai et al. |
| 2007/0001982 | A1 | 1/2007 | Ito et al. |
| 2007/0001983 | A1 | 1/2007 | Ito et al. |
| 2007/0001984 | A1 | 1/2007 | Kumagai et al. |
| 2007/0002061 | A1 | 1/2007 | Kumagai et al. |
| 2007/0002062 | A1 | 1/2007 | Kodaira et al. |
| 2007/0002063 | A1 | 1/2007 | Kumagai et al. |
| 2007/0002188 | A1 | 1/2007 | Kumagai et al. |
| 2007/0002509 | A1 | 1/2007 | Kumagai et al. |
| 2007/0002667 | A1 | 1/2007 | Kodaira et al. |
| 2007/0002669 | A1 | 1/2007 | Kodaira et al. |
| 2007/0002670 | A1 | 1/2007 | Kodaira et al. |
| 2007/0002671 | A1 | 1/2007 | Kumagai et al. |
| 2007/0013074 | A1 | 1/2007 | Kodaira et al. |
| 2007/0013634 | A1 | 1/2007 | Saiki et al. |
| 2007/0013635 | A1 | 1/2007 | Ito et al. |
| 2007/0013684 | A1 | 1/2007 | Kodaira et al. |
| 2007/0013685 | A1 | 1/2007 | Kodaira et al. |
| 2007/0013687 | A1 | 1/2007 | Kodaira et al. |
| 2007/0013706 | A1 | 1/2007 | Kodaira et al. |
| 2007/0013707 | A1 | 1/2007 | Kodaira et al. |
| 2007/0016700 | A1 | 1/2007 | Kodaira et al. |
| 2007/0035503 | A1 | 2/2007 | Kurokawa et al. |
| 2007/0187762 | A1 | 8/2007 | Saiki et al. |

FOREIGN PATENT DOCUMENTS

| | | |
|---|---|---|
| CN | 1542964 | 11/2004 |
| EP | 0 499 478 A2 | 8/1992 |
| JP | A 63-225993 | 9/1988 |
| JP | A 1-171190 | 7/1989 |
| JP | A 4-370595 | 12/1992 |
| JP | A 5-181154 | 7/1993 |
| JP | A 7-281634 | 10/1995 |
| JP | A 8-69696 | 3/1996 |
| JP | A 11-261011 | 9/1999 |
| JP | A 11-274424 | 10/1999 |
| JP | A 11-330393 | 11/1999 |
| JP | A-2001-067868 | 3/2001 |
| JP | A 2001-222249 | 8/2001 |
| JP | A 2001-222276 | 8/2001 |
| JP | A 2002-244624 | 8/2002 |
| JP | A-2002-358777 | 12/2002 |
| JP | A 2003-022063 | 1/2003 |
| JP | A 2003-330433 | 11/2003 |
| JP | A 2004-040042 | 2/2004 |
| JP | A 2004-146806 | 5/2004 |
| JP | A 2004-159314 | 6/2004 |
| JP | A 2004-328456 | 11/2004 |
| JP | A 2005-17725 | 1/2005 |
| JP | A 2005-72607 | 3/2005 |
| KR | A 1992-17106 | 9/1992 |
| KR | 1999-88197 | 12/1999 |
| KR | A 2001-100814 | 11/2001 |

| | | |
|---|---|---|
| KR | 10-2005-0011743 | 1/2005 |
| TW | 501080 | 9/2002 |
| TW | 522366 | 3/2003 |
| TW | 1224300 | 3/2003 |
| TW | 563081 | 11/2003 |

OTHER PUBLICATIONS

Nov. 10, 2005, Satoru Kodaira et al.
Nov. 10, 2005, Takashi Kumagai et al.

* cited by examiner

FIG. 4

| | WITH MEMORY (RAM) | | WITHOUT MEMORY | | CSTN | TFD |
|---|---|---|---|---|---|---|
| | AMORPHOUS TFT | LOW-TEMPERATURE POLYSILICON TFT | AMORPHOUS TFT | LOW-TEMPERATURE POLYSILICON TFT | | |
| MEMORY (RAM) | INCLUDE | INCLUDE | NOT INCLUDE | NOT INCLUDE | INCLUDE | INCLUDE |
| DATA DRIVER | INCLUDE | INCLUDE | INCLUDE | INCLUDE | INCLUDE | INCLUDE |
| SCAN DRIVER | INCLUDE | NOT INCLUDE | INCLUDE | NOT INCLUDE | INCLUDE | INCLUDE |
| LOGIC CIRCUIT (G/A) | INCLUDE | INCLUDE | INCLUDE | INCLUDE | INCLUDE | INCLUDE |
| GRAYSCALE VOLTAGE GENERATION CIRCUIT ($\gamma$) | INCLUDE | INCLUDE | INCLUDE | INCLUDE | NOT INCLUDE | NOT INCLUDE |
| POWER SUPPLY CIRCUIT | INCLUDE | INCLUDE | INCLUDE | INCLUDE | INCLUDE | INCLUDE |

AMPLITUDE ADJUSTMENT

INCLINATION ADJUSTMENT

FINE ADJUSTMENT

HORIZONTAL TYPE CELL

VERTICAL TYPE CELL

FIG.23A HORIZONTAL TYPE CELL
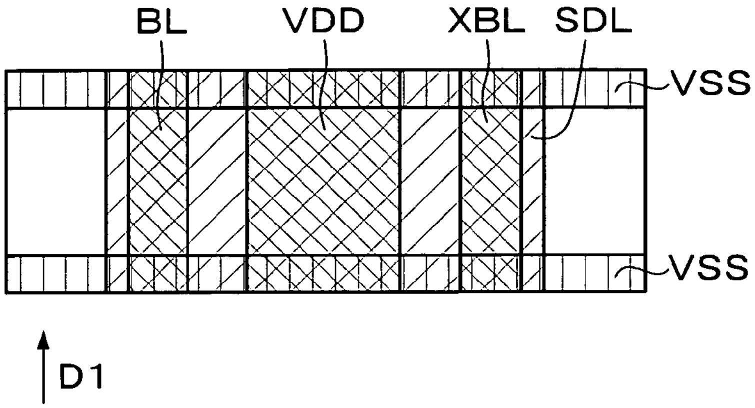
| | |
|---|---|
| ME5 | GL (GRAYSCALE VOLTAGE OUTPUT LINE) |
| ME4 | SDL(VSS) |
| ME3 | WL,VSS |
| ME2 | BL,XBL,VDD |
| ME1 | NODE CONNECTION |
FIG.23B VERTICAL TYPE CELL
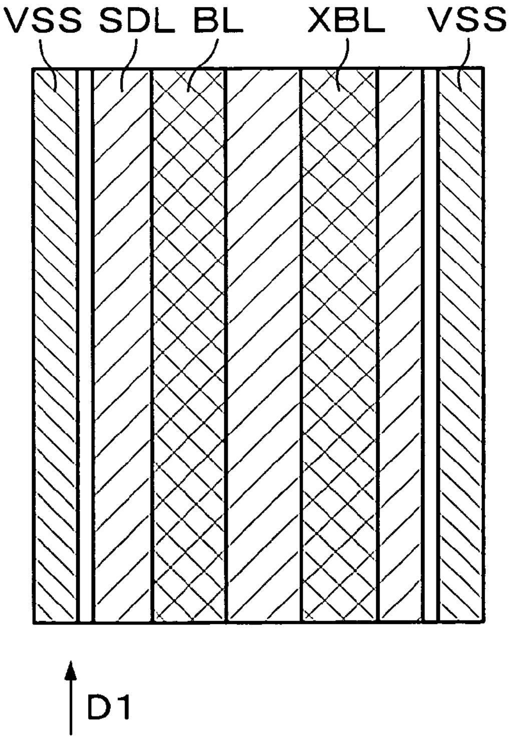
| | |
|---|---|
| ME5 | GL (GRAYSCALE VOLTAGE OUTPUT LINE) |
| ME4 | SDL(VSS) |
| ME3 | BL,XBL,VSS |
| ME2 | WL,VDD |
| ME1 | NODE CONNECTION |

INTEGRATED CIRCUIT DEVICE AND ELECTRONIC INSTRUMENT

Japanese Patent Application No. 2005-192478, filed on Jun. 30, 2005, is hereby incorporated by reference in its entirety.

BACKGROUND OF THE INVENTION

The present invention relates to an integrated circuit device and an electronic instrument.

A display driver (LCD driver) is an example of an integrated circuit device which drives a display panel such as a liquid crystal panel (JP-A-2001-222249). A reduction in the chip size is required for the display driver in order to reduce cost.

However, the size of the display panel incorporated in a portable telephone or the like is almost constant. Therefore, if the chip size is reduced by merely shrinking the integrated circuit device as the display driver by using a microfabrication technology, it becomes difficult to mount the integrated circuit device.

SUMMARY

According to a first aspect of the invention, there is provided an integrated circuit device, comprising:

first to Nth circuit blocks (N is an integer larger than one) disposed along a first direction, when the first direction is a direction from a first side of the integrated circuit device toward a third side which is opposite to the first side, the first side being a short side, and when a second direction is a direction from a second side of the integrated circuit device toward a fourth side which is opposite to the second side, the second side being a long side, wherein the first to Nth circuit blocks include:

a logic circuit block which sets grayscale characteristic adjustment data;

a grayscale voltage generation circuit block which generates grayscale voltages based on the set adjustment data;

at least one data driver block which receives the grayscale voltages from the grayscale voltage generation circuit block and drives data lines; and a power supply circuit block which generates a power supply voltage; and wherein the at least one data driver block is disposed between the logic circuit block and the grayscale voltage generation circuit block, and the power supply circuit block.

According to a second aspect of the invention, there is provided an electronic instrument, comprising:

the above-described integrated circuit device; and a display panel driven by the integrated circuit device.

BRIEF DESCRIPTION OF THE SEVERAL VIEWS OF THE DRAWING

FIG. 4 is an example of various types of display drivers and circuit blocks provided in the display drivers.

FIGS. 23A and 23B are diagrams illustrative of shield line formation methods.

DETAILED DESCRIPTION OF THE EMBODIMENT

Figure 1A:
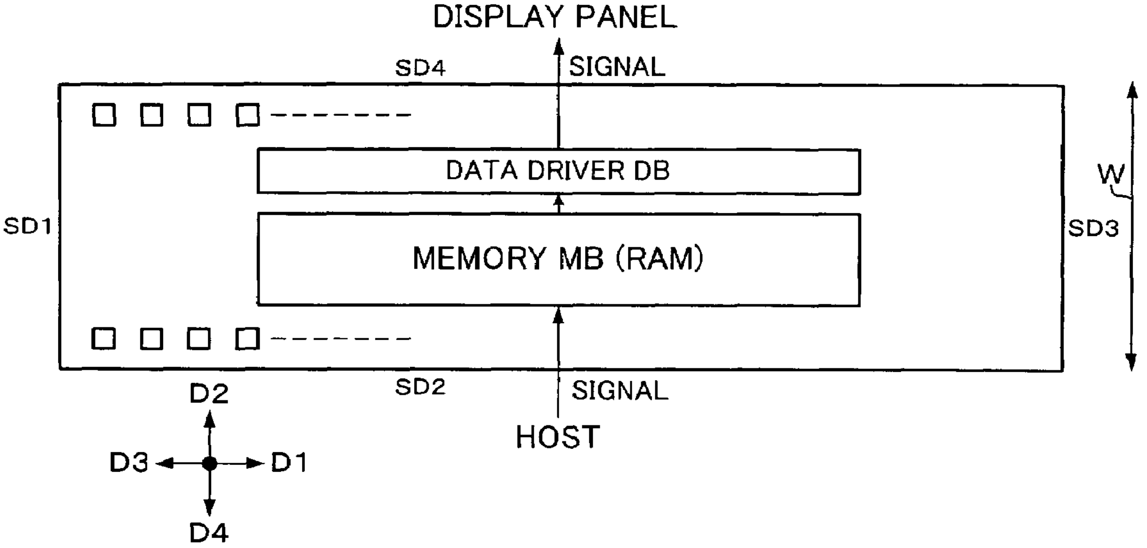
FIGS. 1A to 1C show an integrated circuit device which is a comparative example of one embodiment of the invention.

The invention may provide an integrated circuit device which realizes a reduction in the circuit area, and an electronic instrument including the same.

According to one embodiment of the invention, there is provided an integrated circuit device, comprising:

first to Nth circuit blocks (N is an integer larger than one) disposed along a first direction, when the first direction is a direction from a first side of the integrated circuit device toward a third side which is opposite to the first side, the first side being a short side, and when a second direction is a direction from a second side of the integrated circuit device toward a fourth side which is opposite to the second side, the second side being a long side, wherein the first to Nth circuit blocks include:

a logic circuit block which sets grayscale characteristic adjustment data;

a grayscale voltage generation circuit block which generates grayscale voltages based on the set adjustment data;

at least one data driver block which receives the grayscale voltages from the grayscale voltage generation circuit block and drives data lines; and a power supply circuit block which generates a power supply voltage; and wherein the at least one data driver block is disposed between the logic circuit block and the grayscale voltage generation circuit block, and the power supply circuit block.

In the embodiment, the first to Nth circuit blocks are disposed along the first direction, and include the logic circuit block, the grayscale voltage generation circuit block, the data driver block, and the power supply circuit block. In the embodiment, the data driver block is disposed between the logic circuit block and the grayscale voltage generation circuit block and the power supply circuit block. Therefore, interconnects and transistors can be disposed by utilizing the free space on the side of the logic circuit block or the power supply circuit block in the second direction or the fourth direction opposite to the second direction, whereby the interconnect and arrangement efficiency can be increased. Moreover, since the data driver block can be concentrated near the center of the integrated circuit device, data signal output lines from the data driver block can be efficiently and simply disposed, for example. This enables the width of the integrated circuit device in the second direction to be reduced, whereby a slim integrated circuit device can be provided.

In this integrated circuit device, the logic circuit block and the grayscale voltage generation circuit block may be disposed adjacent to each other along the first direction.

This enables the width of the integrated circuit device in the second direction to be reduced in comparison with a method of disposing the logic circuit block and grayscale voltage generation circuit block along the second direction, whereby a slim integrated circuit device can be provided. Moreover, even if the circuit configuration or the like of the logic circuit block or the grayscale voltage generation circuit block is changed, the other circuit block can be prevented from being affected by such a change, whereby the design efficiency can be improved.

In this integrated circuit device, the grayscale voltage generation circuit block may be disposed between the data driver block and the logic circuit block.

This enables the adjustment data signal lines and the grayscale voltage output lines to be efficiently disposed, whereby the interconnect efficiency can be increased.

In this integrated circuit device, the first to Nth circuit blocks may include at least one memory block which stores image data; and the memory block and the data driver block may be disposed adjacent to each other along the first direction.

This enables the width of the integrated circuit device in the second direction to be reduced in comparison with a method of disposing the memory block and the data driver block along the second direction, whereby a slim integrated circuit device can be provided. Moreover, when the configuration or the like of the memory block or the data driver block is changed, the effects on the remaining circuit blocks can be minimized.

In this integrated circuit device, the first to Nth circuit blocks may include:

first to Ith memory blocks (I is an integer larger than one); and first to Ith data driver blocks respectively disposed adjacent to the first to Ith memory blocks along the first direction.

This enables arrangement of the first to Ith memory blocks in a number optimum for the number of bits of the storage target image data and the first to Ith data driver blocks corresponding to the first to Ith memory blocks, for example. Moreover, the width in the second direction and the length in the first direction of the integrated circuit device can be adjusted by the number of blocks. In particular, the width in the second direction can be reduced.

In this integrated circuit device, the grayscale voltage generation circuit block may include:

a select voltage generation circuit which outputs select voltages based on the power supply voltage; and a grayscale voltage select circuit which selects and outputs the grayscale voltages based on the select voltages and the adjustment data set by the logic circuit block.

In this integrated circuit device, the select voltage generation circuit may be disposed on the second direction side of the grayscale voltage select circuit or on a fourth direction side of the grayscale voltage select circuit, the fourth direction being opposite to the second direction.

This enables the signal lines for the adjustment data and the select voltages to be efficiently disposed.

In this integrated circuit device, the grayscale voltage select circuit may be disposed between the data driver block and the logic circuit block.

This enables the signal lines for the adjustment data, the select voltages, and the grayscale voltages to be efficiently disposed.

In this integrated circuit device, grayscale voltage output lines to which the grayscale voltages are output from the grayscale voltage generation circuit block may be disposed along the first direction and above the first to Nth circuit blocks.

This enables the grayscale voltage output lines to be efficiently disposed by effectively utilizing the region of the first to Nth circuit blocks, whereby the interconnect efficiency can be increased.

In this integrated circuit device, the first to Nth circuit blocks may include at least one memory block which stores image data; and in the memory block, shield lines may be disposed in a layer above bitlines, and grayscale voltage output lines to which the grayscale voltages are output from the grayscale voltage generation circuit block may be disposed in a layer above the shield lines.

This effectively prevents a problem in which the voltage levels of the bitlines are changed due to capacitive coupling.

In the memory block of this integrated circuit device, the bitlines may be disposed along the first direction, and the shield lines may be disposed along the first direction so that the shield lines overlaps the bitlines.

This enables effective shielding of the bitlines.

This integrated circuit device may comprise:

a first interface region provided along the fourth side and on the second direction side of the first to Nth circuit blocks; and a second interface region provided along the second side and on a fourth direction side of the first to Nth circuit blocks, the fourth direction being opposite to the second direction.

According to one embodiment of the invention, there is provided an electronic instrument, comprising:

the above-described integrated circuit device; and a display panel driven by the integrated circuit device.

These embodiments of the invention will be described in detail below, with reference to the drawings. Note that the embodiments described below do not in any way limit the scope of the invention laid out in the claims herein. In addition, not all of the elements of the embodiments described below should be taken as essential requirements of the invention.

1. Comparative Example

FIG. 1A shows an integrated circuit device 500 which is a comparative example of one embodiment of the invention. The integrated circuit device 500 shown in FIG. 1A includes a memory block MB (display data RAM) and a data driver block DB. The memory block MB and the data driver block DB are disposed along a direction D2. The memory block MB and the data driver block DB are ultra-flat blocks of which the length along a direction D1 is longer than the width in the direction D2.

Image data supplied from a host is written into the memory block MB. The data driver block DB converts the digital image data written into the memory block MB into an analog data voltage, and drives data lines of a display panel. In FIG. 1A, the image data signal flows in the direction D2. Therefore, in the comparative example shown in FIG. 1A, the memory block MB and the data driver block DB are disposed along the direction D2 corresponding to the signal flow. This reduces the path between the input and the output so that a signal delay can be optimized, whereby an efficient signal transmission can be achieved.

However, the comparative example shown in FIG. 1A has the following problems.

Figure 2A:
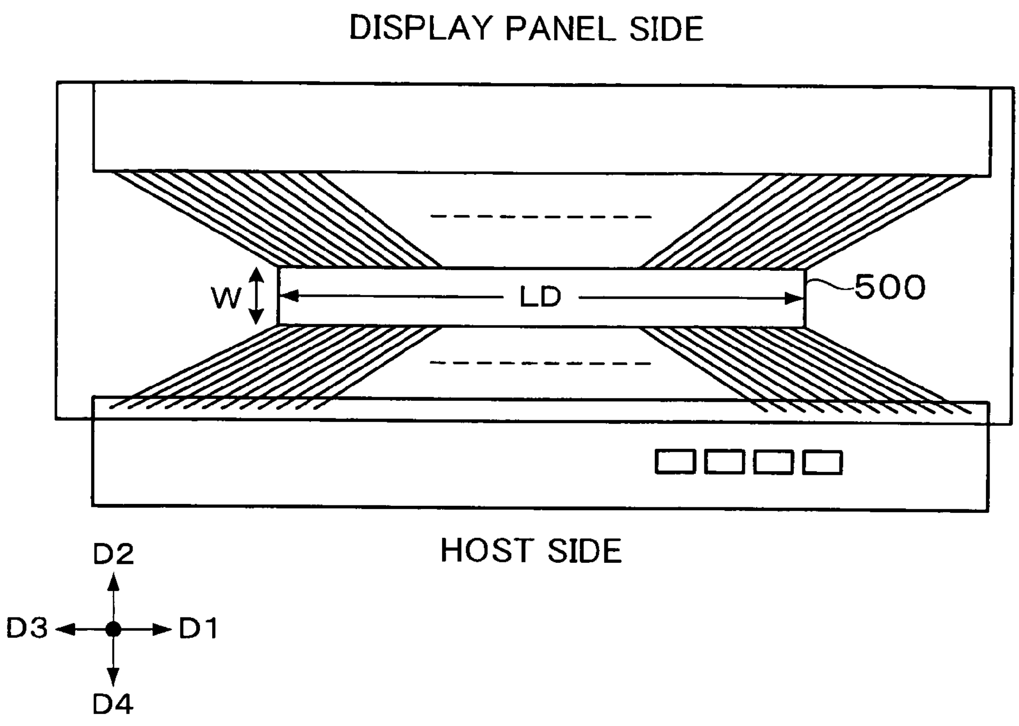
FIGS. 2A and 2B are illustrative of mounting of an integrated circuit device.

First, a reduction in the chip size is required for an integrated circuit device such as a display driver in order to reduce cost. However, if the chip size is reduced by merely shrinking the integrated circuit device 500 by using a microfabrication technology, the size of the integrated circuit device 500 is reduced not only in the short side direction but also in the long side direction. Therefore, it becomes difficult to mount the integrated circuit device 500 as shown in FIG. 2A. Specifically, it is desirable that the output pitch be 22 μm or more, for example. However, the output pitch is reduced to 17 μm by merely shrinking the integrated circuit device 500 as shown in FIG. 2A, for example, whereby it becomes difficult to mount the integrated circuit device 500 due to the narrow pitch. Moreover, the number of glass substrates obtained is decreased due to an increase in the glass frame of the display panel, whereby cost is increased.

Figure 1B:
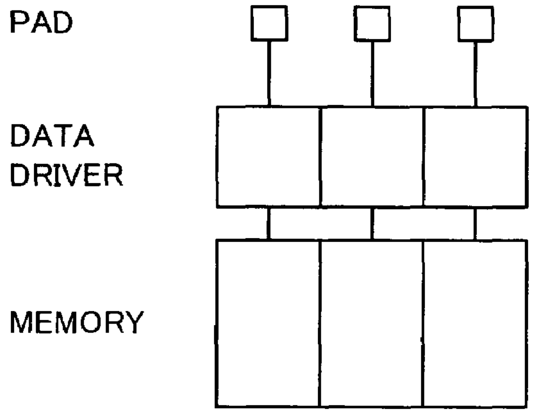
Figure 1C:
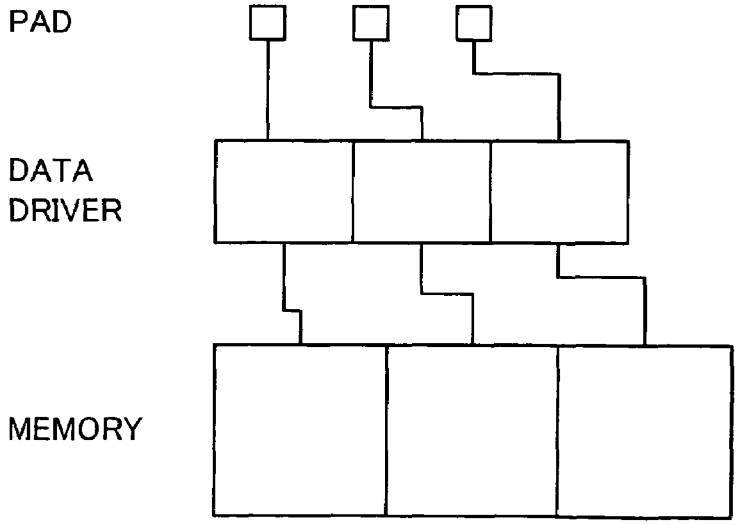

Second, the configurations of the memory and the data driver of the display driver are changed corresponding to the type of display panel (amorphous TFT or low-temperature polysilicon TFT), the number of pixels (QCIF, QVGA, or VGA), the specification of the product, and the like. Therefore, in the comparative example shown in FIG. 1A, even if the pad pitch, the cell pitch of the memory, and the cell pitch of the data driver coincide in one product as shown in FIG. 1B, the pitches do not coincide as shown in FIG. 1C when the configurations of the memory and the data driver are changed. If the pitches do not coincide as shown in FIG. 1C, an unnecessary interconnect region for absorbing the pitch difference must be formed between the circuit blocks. In particular, in the comparative example shown in FIG. 1A in which the block is made flat in the direction D1, the area of an unnecessary interconnect region for absorbing the pitch difference is increased. As a result, the width W of the integrated circuit device 500 in the direction D2 is increased, whereby cost is increased due to an increase in the chip area.

If the layout of the memory and the data driver is changed so that the pad pitch coincides with the cell pitch in order to avoid such a problem, the development period is increased, whereby cost is increased. Specifically, since the circuit configuration and the layout of each circuit block are individually designed and the pitch is adjusted thereafter in the comparative example shown in FIG. 1A, unnecessary area is provided or the design becomes inefficient.

2. Configuration of Integrated Circuit Device

Figure 3:
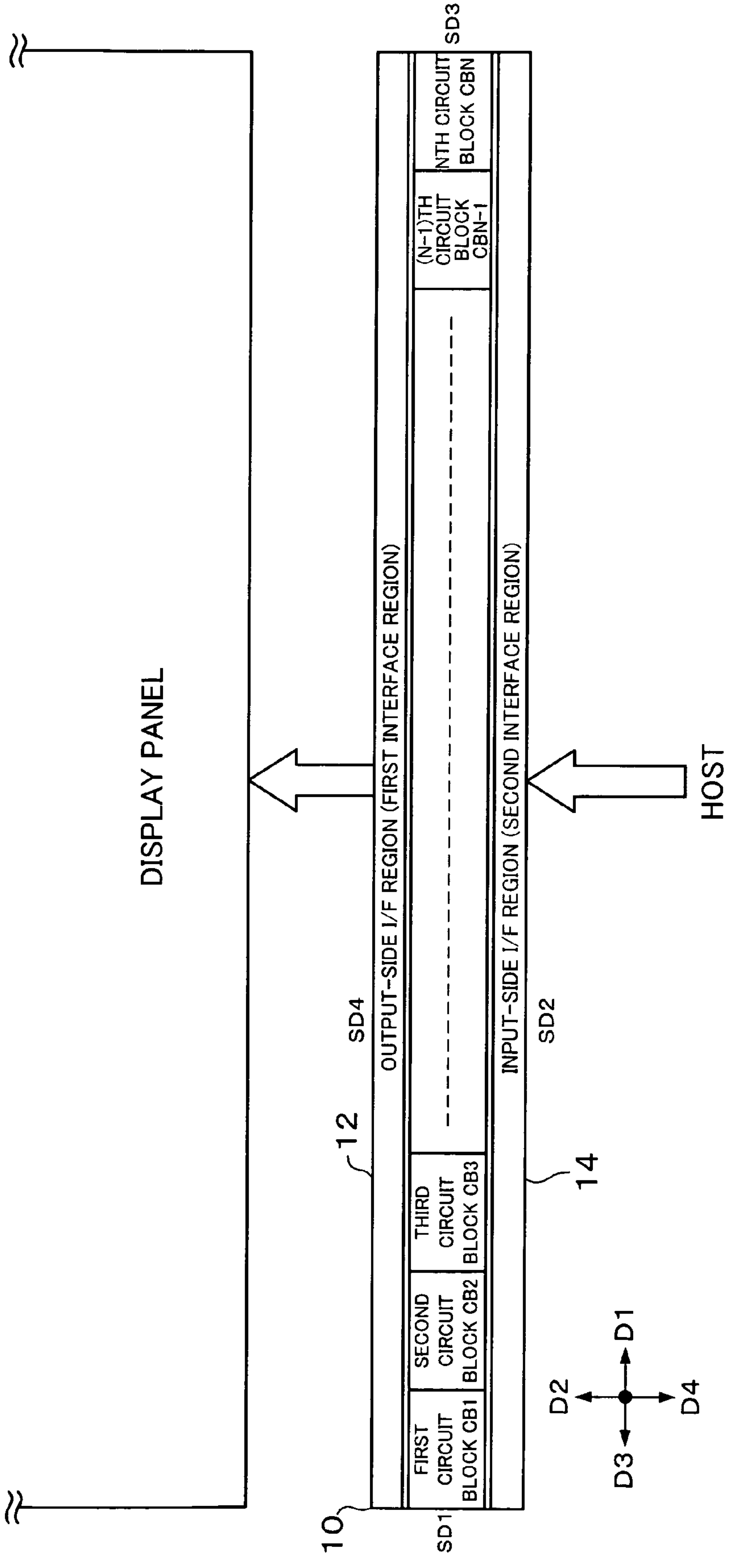
FIG. 3 is a configuration example of an integrated circuit device of the embodiment.

FIG. 3 shows a configuration example of an integrated circuit device 10 of one embodiment of the invention which can solve the above-described problems. In the embodiment, the direction from a first side SD1 (short side) of the integrated circuit device 10 toward a third side SD3 opposite to the first side SD1 is defined as a first direction D1, and the direction opposite to the first direction D1 is defined as a third direction D3. The direction from a second side SD2 (long side) of the integrated circuit device 10 toward a fourth side SD4 opposite to the second side SD2 is defined as a second direction D2, and the direction opposite to the second direction D2 is defined as a fourth direction D4. In FIG. 3, the left side of the integrated circuit device 10 is the first side SD1, and the right side is the third side SD3. However, the left side may be the third side SD3, and the right side may be the first side SD1.

As shown in FIG. 3, the integrated circuit device 10 of the embodiment includes first to Nth circuit blocks CB1 to CBN (N is an integer larger than one) disposed along the direction D1. Specifically, while the circuit blocks are arranged in the direction D2 in the comparative example shown in FIG. 1A, the circuit blocks CB1 to CBN are arranged in the direction D1 in the embodiment. Each circuit block is a relatively square block differing from the ultra-flat block as in the comparative example shown in FIG. 1A.

The integrated circuit device 10 includes an output-side I/F region 12 (first interface region in a broad sense) provided along the side SD4 and on the D2 side of the first to Nth circuit blocks CB1 to CBN. The integrated circuit device 10 includes an input-side I/F region 14 (second interface region in a broad sense) provided along the side SD2 and on the D4 side of the first to Nth circuit blocks CB1 to CBN. In more detail, the output-side I/F region 12 (first I/O region) is disposed on the D2 side of the circuit blocks CB1 to CBN without other circuit blocks interposed therebetween, for example. The input-side I/F region 14 (second I/O region) is disposed on the D4 side of the circuit blocks CB1 to CBN without other circuit blocks interposed therebetween, for example. Specifically, only one circuit block (data driver block) exists in the direction D2 at least in the area in which the data driver block exists. When the integrated circuit device 10 is used as an intellectual property (IP) core and incorporated in another integrated circuit device, the integrated circuit device 10 may be configured to exclude at least one of the I/F regions 12 and 14.

The output-side (display panel side) I/F region 12 is a region which serves as an interface between the integrated circuit device 10 and the display panel, and includes pads and various elements such as output transistors and protective elements connected with the pads. In more detail, the output-side I/F region 12 includes output transistors for outputting data signals to data lines and scan signals to scan lines, for example. When the display panel is a touch panel, the output-side I/F region 12 may include input transistors.

The input-side I/F region 14 is a region which serves as an interface between the integrated circuit device 10 and a host (MPU, image processing controller, or baseband engine), and may include pads and various elements connected with the pads, such as input (input-output) transistors, output transistors, and protective elements. In more detail, the input-side I/F region 14 includes input transistors for inputting signals (digital signals) from the host, output transistors for outputting signals to the host, and the like.

An output-side or input-side I/F region may be provided along the short side SD1 or SD3. Bumps which serve as external connection terminals may be provided in the I/F (interface) regions 12 and 14, or may be provided in other regions (first to Nth circuit blocks CB1 to CBN). When providing the bumps in the region other than the I/F regions 12 and 14, the bumps are formed by using a small bump technology (e.g. bump technology using resin core) other than a gold bump technology.

The first to Nth circuit blocks CB1 to CBN may include at least two (or three) different circuit blocks (circuit blocks having different functions). Taking an example in which the integrated circuit device 10 is a display driver, the circuit blocks CB1 to CBN may include at least two of a data driver block, a memory block, a scan driver block, a logic circuit block, a grayscale voltage generation circuit block, and a power supply circuit block. In more detail, the circuit blocks CB1 to CBN may include at least a data driver block and a logic circuit block, and may further include a grayscale voltage generation circuit block. When the integrated circuit device 10 includes a built-in memory, the circuit blocks CB1 to CBN may further include a memory block.

FIG. 4 shows an example of various types of display drivers and circuit blocks provided in the display drivers. In an amorphous thin film transistor (TFT) panel display driver including a built-in memory (RAM), the circuit blocks CB1 to CBN include a memory block, a data driver (source driver) block, a scan driver (gate driver) block, a logic circuit (gate array circuit) block, a grayscale voltage generation circuit (?-correction circuit) block, and a power supply circuit block. In a low-temperature polysilicon (LTPS) TFT panel display driver including a built-in memory, since the scan driver can be formed on a glass substrate, the scan driver block may be omitted. The memory block may be omitted in an amorphous TFT panel display driver which does not include a memory, and the memory block and the scan driver block may be omitted in a low-temperature polysilicon TFT panel display driver which does not include a memory. In a color super twisted nematic (CSTN) panel display driver and a thin film diode (TFD) panel display driver, the grayscale voltage generation circuit block may be omitted.

Figure 5A:
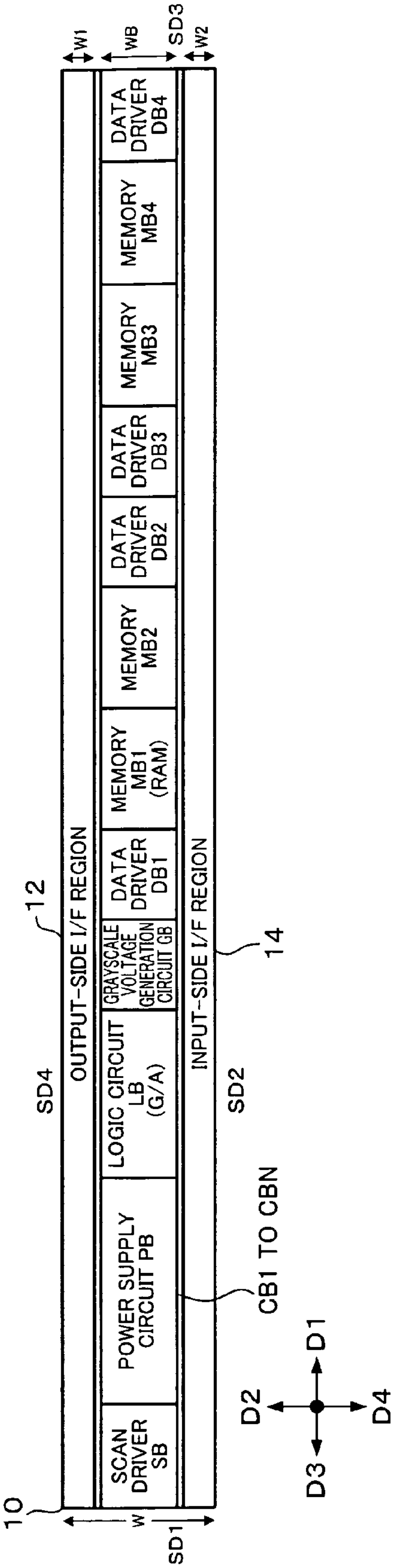
FIGS. 5A and 5B are planar layout examples of the integrated circuit device of the embodiment.
Figure 5B:
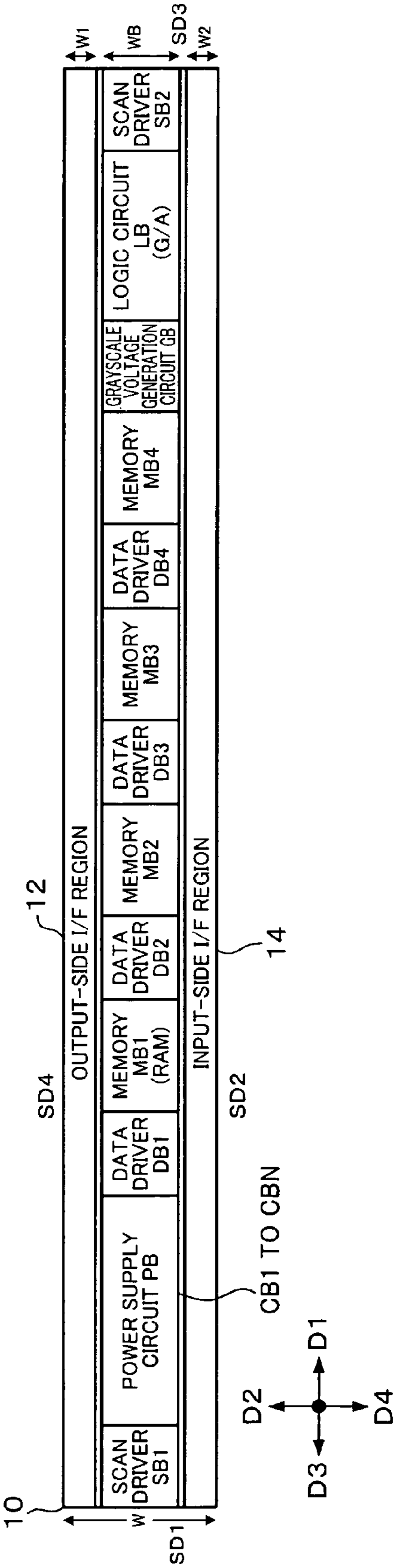

FIGS. 5A and 5B show examples of a planar layout of the integrated circuit device 10 as the display driver of the embodiment. FIGS. 5A and 5B are examples of an amorphous TFT panel display driver including a built-in memory. FIG. 5A shows a QCIF and 32-grayscale display driver, and FIG. 5B shows a QVGA and 64-grayscale display driver.

In FIGS. 5A and 5B, the first to Nth circuit blocks CB1 to CBN include first to fourth memory blocks MB1 to MB4 (first to Ith memory blocks in a broad sense; I is an integer larger than one). The first to Nth circuit blocks CB1 to CBN include first to fourth data driver blocks DB1 to DB4 (first to Ith data driver blocks in a broad sense) respectively disposed adjacent to the first to fourth memory blocks MB1 to MB4 along the direction D1. In more detail, the memory block MB1 and the data driver block DB1 are disposed adjacent to each other along the direction D1, and the memory block MB2 and the data driver block DB2 are disposed adjacent to each other along the direction D1. The memory block MB1 adjacent to the data driver block DB1 stores image data (display data) used by the data driver block DB1 to drive the data line, and the memory block MB2 adjacent to the data driver block DB2 stores image data used by the data driver block DB2 to drive the data line.

In FIG. 5A, the data driver block DB1 (Jth data driver block in a broad sense; $1 \leqq J < I$) of the data driver blocks DB1 to DB4 is disposed adjacently on the D3 side of the memory block MB1 (Jth memory block in a broad sense) of the memory blocks MB1 to MB4. The memory block MB2 ((J+1)th memory block in a broad sense) is disposed adjacently on the D1 side of the memory block MB1. The data driver block DB2 ((J+1)th data driver block in a broad sense) is disposed adjacently on the D1 side of the memory block MB2. The arrangement of the memory blocks MB3 and MB4 and the data driver blocks DB3 and DB4 is the same as described above. In FIG. 5A, the memory block MB1 and the data driver block DB1 and the memory block MB2 and the data driver block DB2 are disposed line-symmetrical with respect to the borderline between the memory blocks MB1 and MB2, and the memory block MB3 and the data driver block DB3 and the memory block MB4 and the data driver block DB4 are disposed line-symmetrical with respect to the borderline between the memory blocks MB3 and MB4. In FIG. 5A, the data driver blocks DB2 and DB3 are disposed adjacent to each other. However, another circuit block may be disposed between the data driver blocks DB2 and DB3.

In FIG. 5B, the data driver block DB1 (Jth data driver block) of the data driver blocks DB1 to DB4 is disposed adjacently on the D3 side of the memory block MB1 (Jth memory block) of the memory blocks MB1 to MB4. The data driver block DB2 ((J+1)th data driver block) is disposed on the D1 side of the memory block MB1. The memory block MB2 ((J+1)th memory block) is disposed on the D1 side of the data driver block DB2. The data driver block DB3, the memory block MB3, the data driver block DB4, and the memory block MB4 are disposed in the same manner as described above. In FIG. 5B, the memory block MB1 and the data driver block DB2, the memory block MB2 and the data driver block DB3, and the memory block MB3 and the data driver block DB4 are respectively disposed adjacent to each other. However, another circuit block may be disposed between these blocks.

The layout arrangement shown in FIG. 5A has an advantage in that a column address decoder can be used in common between the memory blocks MB1 and MB2 or the memory blocks MB3 and MB4 (between the Jth and (J+1)th memory blocks). The layout arrangement shown in FIG. 5B has an advantage in that the interconnect pitch of the data signal output lines from the data driver blocks DB1 to DB4 to the output-side I/F region 12 can be equalized so that the interconnect efficiency can be increased.

The layout arrangement of the integrated circuit device 10 of the embodiment is not limited to those shown in FIGS. 5A and 5B. For example, the number of memory blocks and data driver blocks may be set at 2, 3, or 5 or more, or the memory block and the data driver block may not be divided into blocks. A modification in which the memory block is not disposed adjacent to the data driver block is also possible. A configuration is also possible in which the memory block, the scan driver block, the power supply circuit block, or the grayscale voltage generation circuit block is not provided. A circuit block having a width significantly small in the direction D2 (slim circuit block having a width less than the width WB) may be provided between the circuit blocks CB1 to CBN and the output-side I/F region 12 or the input-side I/F region 14. The circuit blocks CB1 to CBN may include a circuit block in which different circuit blocks are arranged in stages in the direction D2. For example, the scan driver circuit and the power supply circuit may be formed in one circuit block.

Figure 6A:
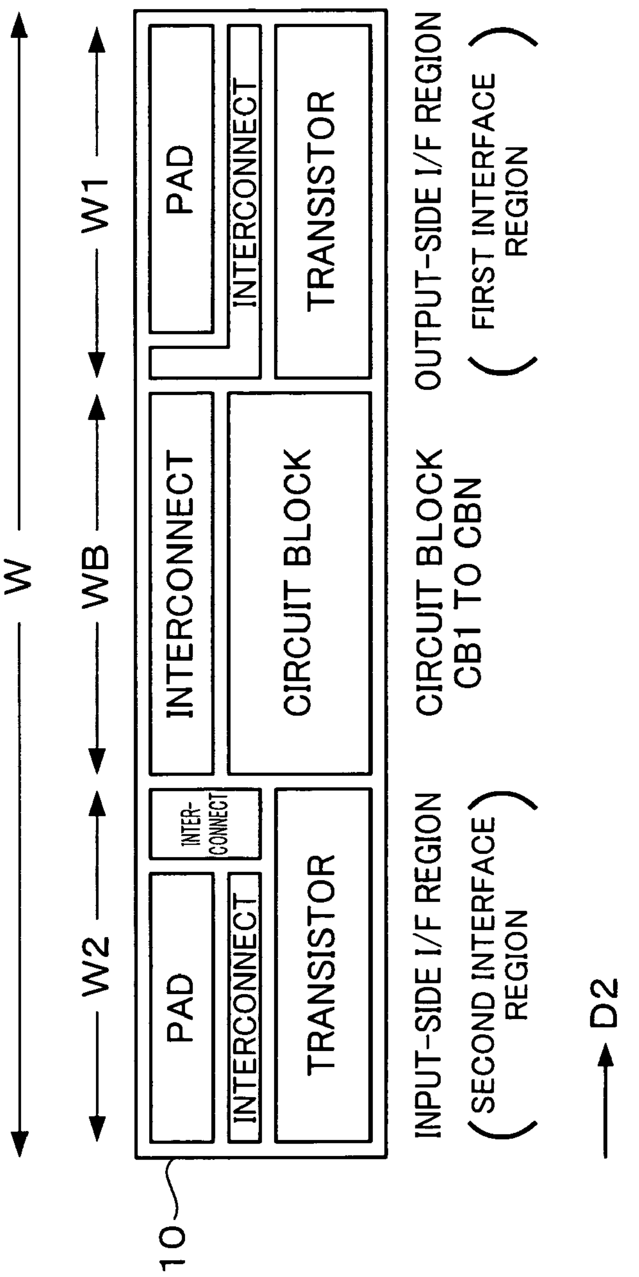
FIGS. 6A and 6B are examples of cross-sectional diagrams of the integrated circuit device.

FIG. 6A shows an example of a cross-sectional diagram of the integrated circuit device 10 of the embodiment along the direction D2. W1, WB, and W2 respectively indicate the widths of the output-side I/F region 12, the circuit blocks CB1 to CBN, and the input-side I/F region 14 in the direction D2. W indicates the width of the integrated circuit device 10 in the direction D2.

In the embodiment, as shown in FIG. 6A, a configuration may be employed in which a circuit blocks is not provided between the circuit blocks CB1 to CBN (data driver block DB) and the output-side I/F region 12 or input-side I/F region 14. Therefore, the relationship "W1+WB+W2≦W<W1+2×WB+W2" is satisfied so that a slim integrated circuit device can be realized. In more detail, the width W in the direction D2 may be set at "W<2 mm". More specifically, the width W in the direction D2 may be set at "W<1.5 mm". It is preferable that "W>0.9 mm" taking inspection and mounting of the chip into consideration. A length LD in the long side direction may be set at "15 mm<LD<27 mm". A chip shape ratio SP (=LD/W) may be set at "SP>10". More specifically, the chip shape ratio SP may be set at "SP>12".

The widths W1, WB, and W2 shown in FIG. 6A indicate the widths of transistor formation regions (bulk regions or active regions) of the output-side I/F region 12, the circuit blocks CB1 to CBN, and the input-side I/F region 14, respectively. Specifically, output transistors, input transistors, input-output transistors, transistors of electrostatic protection elements, and the like are formed in the I/F regions 12 and 14. Transistors which form circuits are formed in the circuit blocks CB1 to CBN. The widths W1, WB, and W2 are determined based on well regions and diffusion regions by which such transistors are formed. In order to realize a slim integrated circuit device, it is preferable to form bumps (active surface bumps) on the transistors of the circuit blocks CB1 to CBN. In more detail, a resin core bump in which the core is formed of a resin and a metal layer is formed on the surface of the resin or the like is formed above the transistor (active region). These bumps (external connection terminals) are connected with the pads disposed in the I/F regions 12 and 14 through metal interconnects. The widths W1, WB, and W2 of the embodiment are not the widths of the bump formation regions, but the widths of the transistor formation regions formed under the bumps.

The widths of the circuit blocks CB1 to CBN in the direction D2 may be identical, for example. In this case, it suffices that the width of each circuit block be substantially identical, and the width of each circuit block may differ in the range of several to 20 μm (several tens of microns), for example. When a circuit block with a different width exists in the circuit blocks CB1 to CBN, the width WB may be the maximum width of the circuit blocks CB1 to CBN. In this case, the maximum width may be the width of the data driver block in the direction D2, for example. In the case where the integrated circuit device includes a memory, the maximum width may be the width of the memory block in the direction D2. A vacant region having a width of about 20 to 30 μm may be provided between the circuit blocks CB1 to CBN and the I/F regions 12 and 14, for example.

In the embodiment, a pad of which the number of stages in the direction D2 is one or more may be disposed in the output-side I/F region 12. Therefore, the width W1 of the output-side I/F region 12 in the direction D2 may be set at "0.13 mm≦W1≦0.4 mm" taking the pad width (e.g. 0.1 mm) and the pad pitch into consideration. Since a pad of which the number of stages in the direction D2 is one can be disposed in the input-side I/F region 14, the width W2 of the input-side I/F region 14 may be set at "0.1 mm≦W2≦0.2 mm". In order to realize a slim integrated circuit device, interconnects for logic signals from the logic circuit block, grayscale voltage signals from the grayscale voltage generation circuit block, and a power supply must be formed on the circuit blocks CB1 to CBN by using global interconnects. The total width of these interconnects is about 0.8 to 0.9 mm, for example. Therefore, the widths WB of the circuit blocks CB1 to CBN may be set at "0.65 mm≦WB≦1.2 mm" taking the total width of these interconnects into consideration.

Since "0.65 mm≦WB≦1.2 mm" is satisfied even if W1=0.4 mm and W2=0.2 mm, WB>W1+W2 is satisfied. When the widths W1, WB, and W2 are minimum values, W1=0.13 mm, WB=0.65 mm, and W2=0.1 mm so that the width W of the integrated circuit device is about 0.88 mm. Therefore, "W=0.88 mm<2×WB=1.3 mm" is satisfied. When the widths W1, WB, and W2 are maximum values, W1=0.4 mm, WB=1.2 mm, and W2=0.2 mm so that the width W of the integrated circuit device is about 1.8 mm. Therefore, "W=1.8 mm<2×WB=2.4 mm" is satisfied. Therefore, the relational equation "W<2×WB" is satisfied so that a slim integrated circuit device is realized.

Figure 6B:
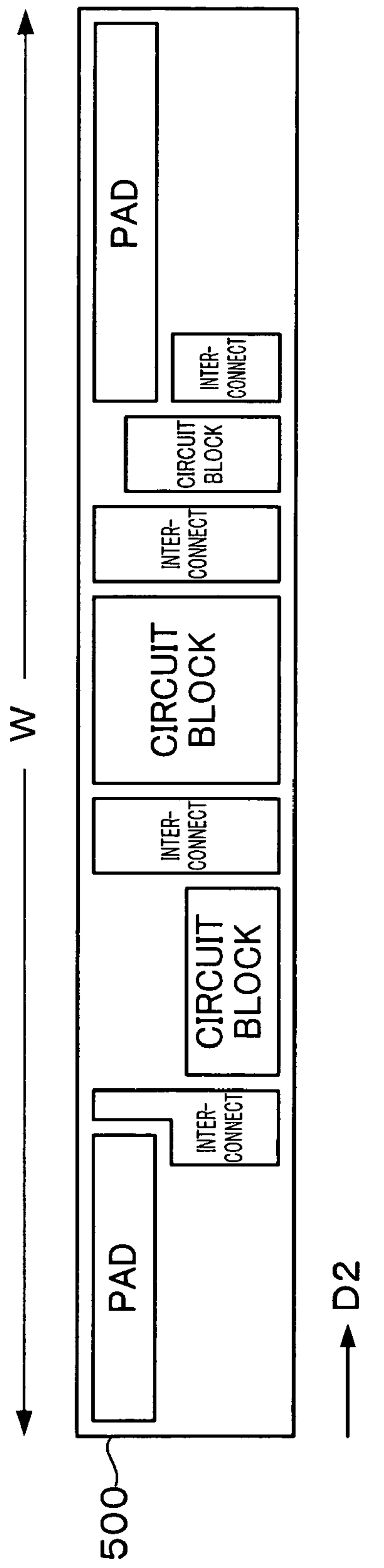

In the comparative example shown in FIG. 1A, two or more circuit blocks are disposed along the direction D2 as shown in FIG. 6B. Moreover, interconnect regions are formed between the circuit blocks and between the circuit blocks and the I/F region in the direction D2. Therefore, since the width W of the integrated circuit device 500 in the direction D2 (short side direction) is increased, a slim chip cannot be realized. Therefore, even if the chip is shrunk by using a microfabrication technology, the length LD in the direction D1 (long side direction) is decreased, as shown in FIG. 2A, so that the output pitch becomes narrow, whereby it becomes difficult to mount the integrated circuit device 500.

Figure 2B:
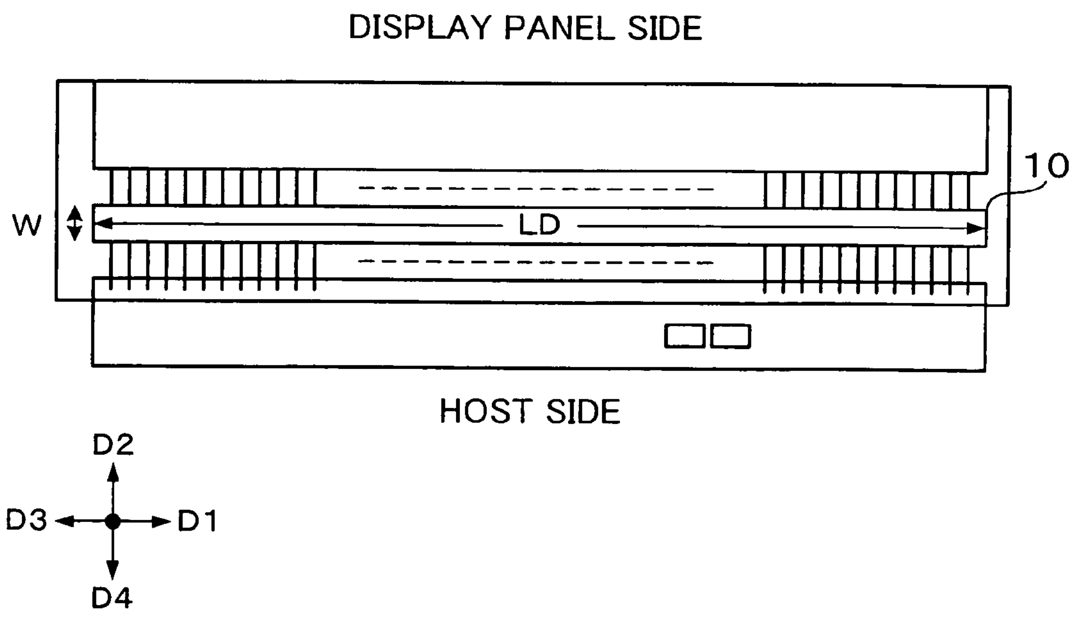

In the embodiment, the circuit blocks CB1 to CBN are disposed along the direction D1 as shown in FIGS. 3, 5A, and 5B. As shown in FIG. 6A, the transistor (circuit element) can be disposed under the pad (bump) (active surface bump). Moreover, the signal lines can be formed between the circuit blocks and between the circuit blocks and the I/F by using the global interconnects formed in the upper layer (lower layer of the pad) of the local interconnects in the circuit blocks. Therefore, since the width W of the integrated circuit device 10 in the direction D2 can be reduced while maintaining the length LD of the integrated circuit device 10 in the direction D1 as shown in FIG. 2B, a very slim chip can be realized. As a result, since the output pitch can be maintained at 22 μm or more, for example, mounting can be facilitated.

In the embodiment, since the circuit blocks CB1 to CBN are disposed along the direction D1, it is possible to easily deal with a change in the product specifications and the like. Specifically, since product of various specifications can be designed by using a common platform, the design efficiency can be increased. For example, when the number of pixels or the number of grayscales of the display panel is increased or decreased in FIGS. 5A and 5B, it is possible to deal with such a situation merely by increasing or decreasing the number of blocks of memory blocks or data driver blocks, the number of readings of image data in one horizontal scan period, or the like. FIGS. 5A and 5B show an example of an amorphous TFT panel display driver including a memory. When developing a low-temperature polysilicon TFT panel product including a memory, it suffices to remove the scan driver block from the circuit blocks CB1 to CBN. When developing a product which does not include a memory, it suffices to remove the memory block from the circuit blocks CB1 to CBN. In the embodiment, even if the circuit block is removed corresponding to the specification, since the effect on the remaining circuit blocks is minimized, the design efficiency can be increased.

In the embodiment, the widths (heights) of the circuit blocks CB1 to CBN in the direction D2 can be uniformly adjusted to the width (height) of the data driver block or the memory block, for example. Since it is possible to deal with an increase or decrease in the number of transistors of each circuit block by increasing or decreasing the length of each circuit block in the direction D1, the design efficiency can be further increased. For example, when the number of transistors is increased or decreased in FIGS. 5A and 5B due to a change in the configuration of the grayscale voltage generation circuit block or the power supply circuit block, it is possible to deal with such a situation by increasing or decreasing the length of the grayscale voltage generation circuit block or the power supply circuit block in the direction D1.

As a second comparative example, a narrow data driver block may be disposed in the direction D1, and other circuit blocks such as the memory block may be disposed along the direction D1 on the D4 side of the data driver block, for example. However, in the second comparative example, since the data driver block having a large width lies between other circuit blocks such as the memory block and the output-side I/F region, the width W of the integrated circuit device in the direction D2 is increased, so that it is difficult to realize a slim chip. Moreover, an additional interconnect region is formed between the data driver block and the memory block, whereby the width W is further increased. Furthermore, when the configuration of the data driver block or the memory block is changed, the pitch difference described with reference to FIGS. 1B and 1C occurs, whereby the design efficiency cannot be increased.

As a third comparative example of the embodiment, only circuit blocks (e.g. data driver blocks) having the same function may be divided and arranged in the direction D1. However, since the integrated circuit device can be provided with only a single function (e.g. function of the data driver) in the third comparative example, development of various products cannot be realized. In the embodiment, the circuit blocks CB1 to CBN include circuit blocks having at least two different functions. Therefore, various integrated circuit devices corresponding to various types of display panels can be provided as shown in FIGS. 4, 5A, and 5B.

3. Circuit Configuration

Figure 7:
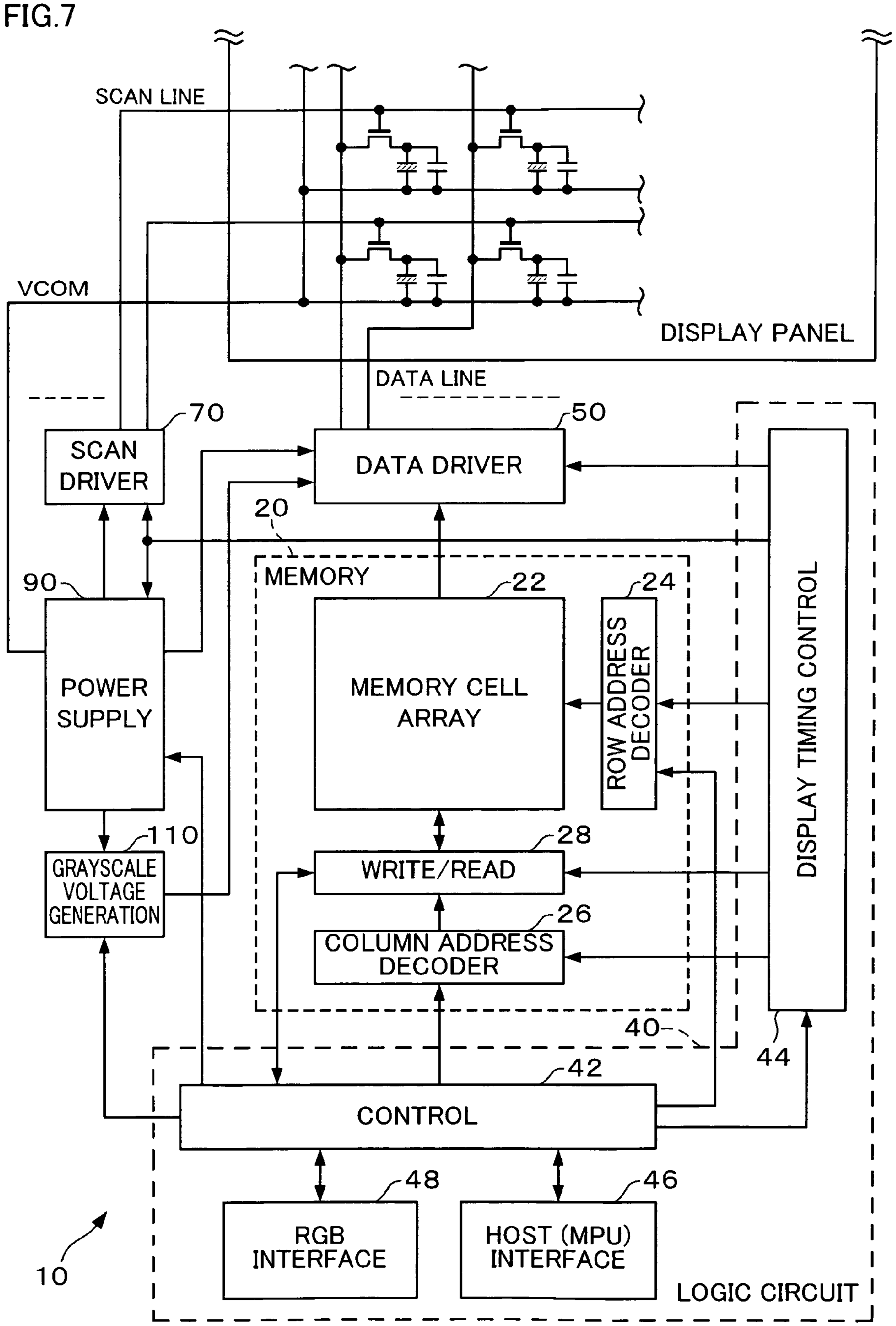
FIG. 7 is a circuit configuration example of the integrated circuit device.

FIG. 7 shows a circuit configuration example of the integrated circuit device 10. The circuit configuration of the integrated circuit device 10 is not limited to the circuit configuration shown in FIG. 7. Various modifications and variations may be made. A memory 20 (display data RAM) stores image data. A memory cell array 22 includes a plurality of memory cells, and stores image data (display data) for at least one frame (one screen). In this case, one pixel is made up of R, G, and B subpixels (three dots), and 6-bit (k-bit) image data is stored for each subpixel, for example. A row address decoder 24 (MPU/LCD row address decoder) decodes a row address and selects a wordline of the memory cell array 22. A column address decoder 26 (MPU column address decoder) decodes a column address and selects a bitline of the memory cell array 22. A write/read circuit 28 (MPU write/read circuit) writes image data into the memory cell array 22 or reads image data from the memory cell array 22. An access region of the memory cell array 22 is defined by a rectangle having a start address and an end address as opposite vertices. Specifically, the access region is defined by the column address and the row address of the start address and the column address and the row address of the end address so that memory access is performed.

A logic circuit 40 (e.g. automatic placement and routing circuit) generates a control signal for controlling display timing, a control signal for controlling data processing timing, and the like. The logic circuit 40 may be formed by automatic placement and routing such as a gate array (G/A). A control circuit 42 generates various control signals and controls the entire device. In more detail, the control circuit 42 outputs grayscale characteristic (?-characteristic) adjustment data (?-correction data) to a grayscale voltage generation circuit 110 and controls voltage generation of a power supply circuit 90. The control circuit 42 controls write/read processing for the memory using the row address decoder 24, the column address decoder 26, and the write/read circuit 28. A display timing control circuit 44 generates various control signals for controlling display timing, and controls reading of image data from the memory into the display panel. A host (MPU) interface circuit 46 realizes a host interface which accesses the memory by generating an internal pulse each time accessed by the host. An RGB interface circuit 48 realizes an RGB interface which writes motion picture RGB data into the memory based on a dot clock signal. The integrated circuit device 10 may be configured to include only one of the host interface circuit 46 and the RGB interface circuit 48.

In FIG. 7, the host interface circuit 46 and the RGB interface circuit 48 access the memory 20 in pixel units. Image data designated by a line address and read in line units is supplied to a data driver 50 in line cycle at an internal display timing independent of the host interface circuit 46 and the RGB interface circuit 48.

Figure 8A:
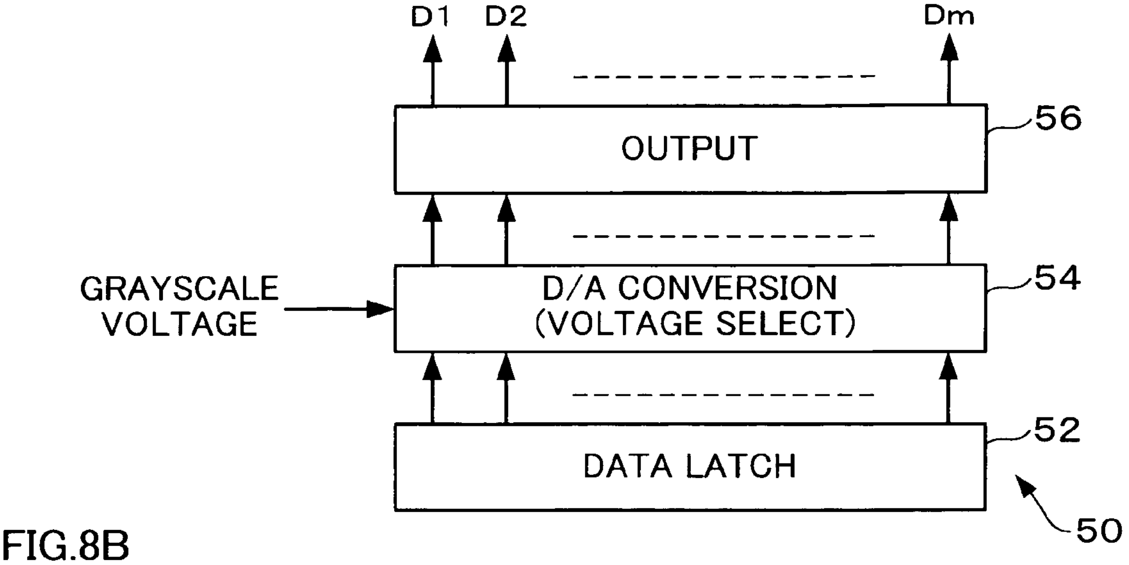
FIGS. 8A to 8C are illustrative of configuration examples of a data driver and a scan driver.

The data driver 50 is a circuit for driving a data line of the display panel. FIG. 8A shows a configuration example of the data driver 50. A data latch circuit 52 latches the digital image data from the memory 20. A D/A conversion circuit 54 (voltage select circuit) performs D/A conversion of the digital image data latched by the data latch circuit 52, and generates an analog data voltage. In more detail, the D/A conversion circuit 54 receives a plurality of (e.g. 64 stages) grayscale voltages (reference voltages) from the grayscale voltage generation circuit 110, selects a voltage corresponding to the digital image data from the grayscale voltages, and outputs the selected voltage as the data voltage. An output circuit 56 (driver circuit or buffer circuit) buffers the data voltage from the D/A conversion circuit 54, and outputs the data voltage to the data line of the display panel to drive the data line. A part of the output circuit 56 (e.g. output stage of operational amplifier) may not be included in the data driver 50 and may be disposed in other region.

Figure 8B:
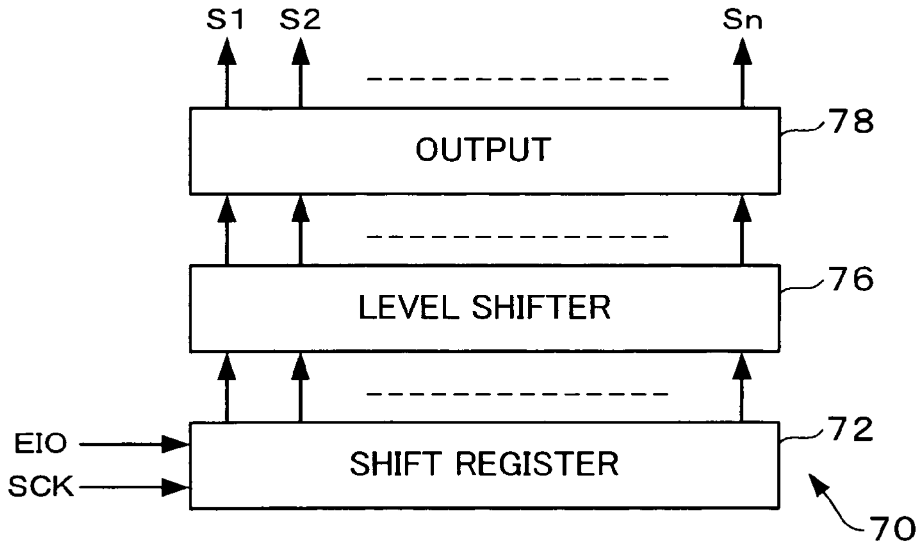
Figure 8C:
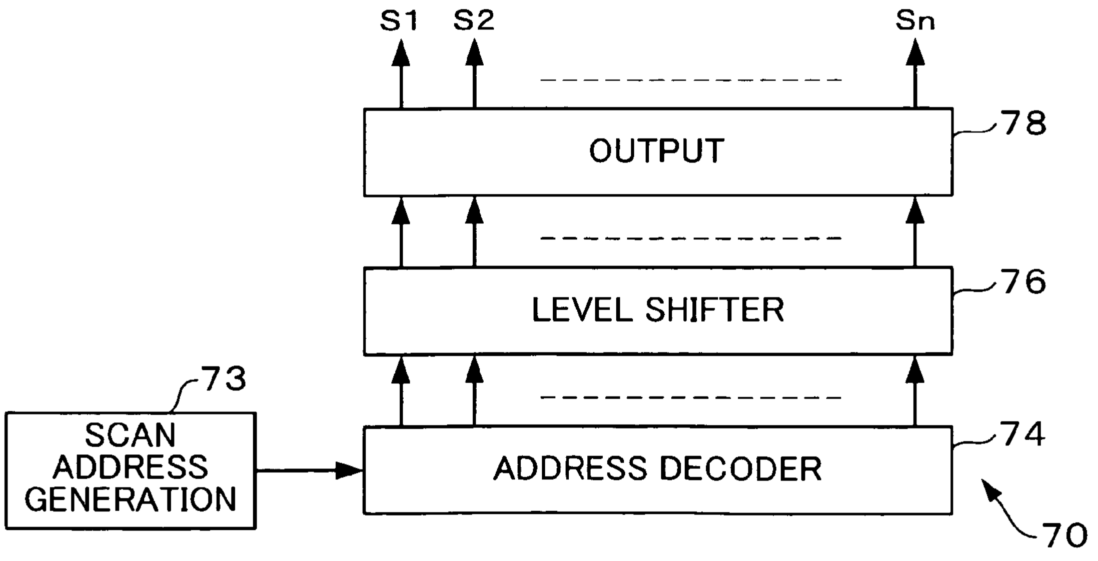

A scan driver 70 is a circuit for driving a scan line of the display panel. FIG. 8B shows a configuration example of the scan driver 70. A shift register 72 includes a plurality of sequentially connected flip-flops, and sequentially shifts an enable input-output signal EIO in synchronization with a shift clock signal SCK. A level shifter 76 converts the voltage level of the signal from the shift register 72 into a high voltage level for selecting the scan line. An output circuit 78 buffers a scan voltage converted and output by the level shifter 76, and outputs the scan voltage to the scan line of the display panel to drive the scan line. The scan driver 70 may be configured as shown in FIG. 8C. In FIG. 8C, a scan address generation circuit 73 generates and outputs a scan address, and an address decoder decodes the scan address. The scan voltage is output to the scan line specified by the decode processing through the level shifter 76 and the output circuit 78.

Figure 9A:
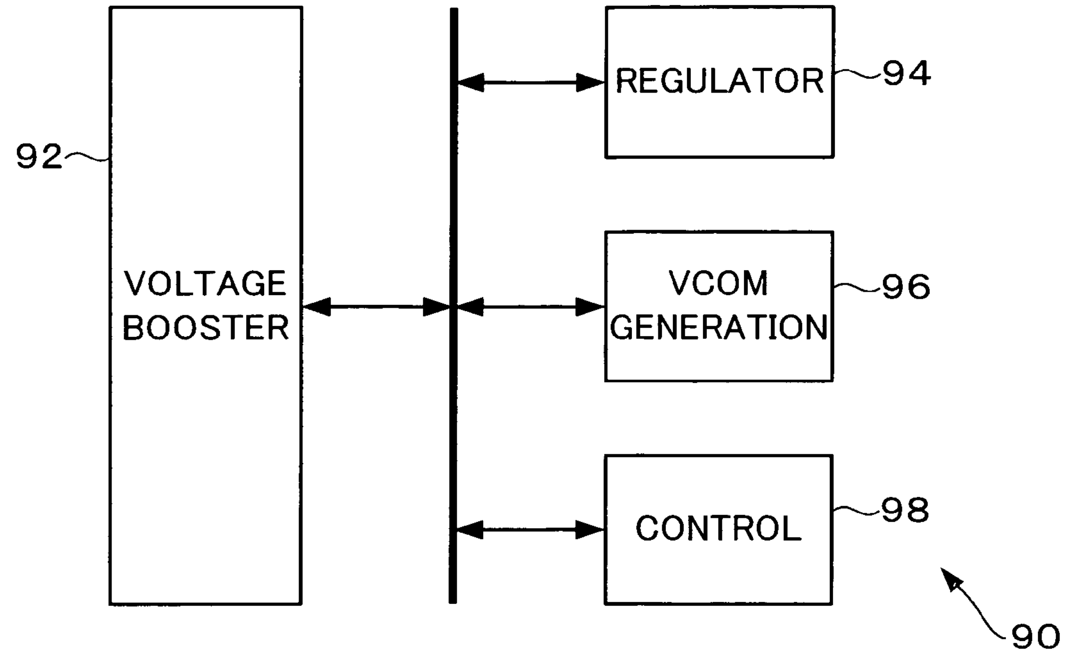
FIGS. 9A and 9B are configuration examples of a power supply circuit and a grayscale voltage generation circuit.

The power supply circuit 90 is a circuit which generates various power supply voltages. FIG. 9A shows a configuration example of the power supply circuit 90. A voltage booster circuit 92 is a circuit which generates a boosted voltage by boosting an input power source voltage or an internal power supply voltage by a charge-pump method using a boost capacitor and a boost transistor, and may include first to fourth voltage booster circuits and the like. A high voltage used by the scan driver 70 and the grayscale voltage generation circuit 110 can be generated by the voltage booster circuit 92. A regulator circuit 94 regulates the level of the boosted voltage generated by the voltage booster circuit 92. A VCOM generation circuit 96 generates and outputs a voltage VCOM supplied to a common electrode of the display panel. A control circuit 98 controls the power supply circuit 90, and includes various control registers and the like.

Figure 9B:
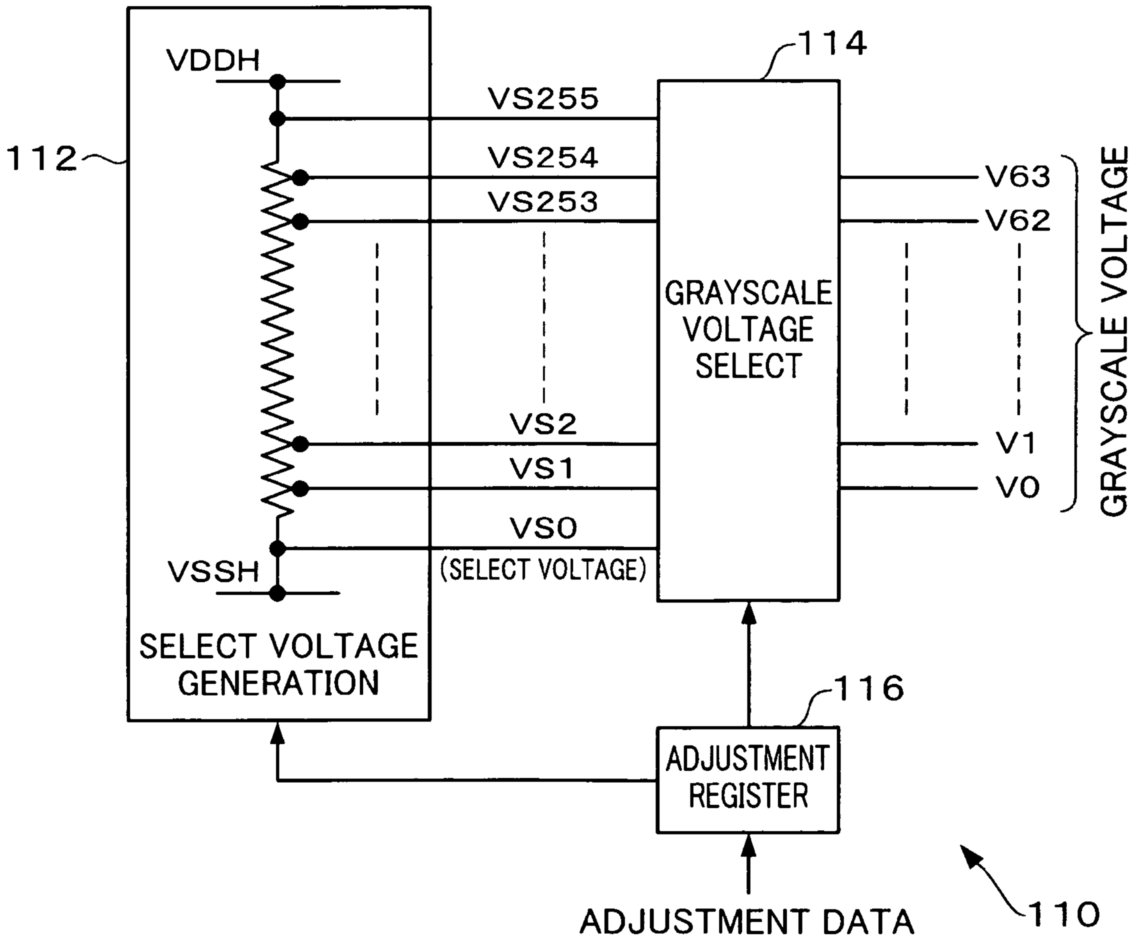

The grayscale voltage generation circuit 110 (?-correction circuit) is a circuit which generates grayscale voltages. FIG. 9B shows a configuration example of the grayscale voltage generation circuit 110. A select voltage generation circuit 112 (voltage divider circuit) outputs select voltages VS0 to VS255 (R select voltages in a broad sense) based on high-voltage power supply voltages VDDH and VSSH generated by the power supply circuit 90. In more detail, the select voltage generation circuit 112 includes a ladder resistor circuit including a plurality of resistor elements connected in series. The select voltage generation circuit 112 outputs voltages obtained by dividing the power supply voltages VDDH and VSSH using the ladder resistor circuit as the select voltages VS0 to VS255. A grayscale voltage select circuit 114 selects 64 (S in a broad sense; R>S) voltages from the select voltages VS0 to VS255 in the case of using 64 grayscales based on the grayscale characteristic adjustment data set in an adjustment register 116 by the logic circuit 40, and outputs the selected voltages as grayscale voltages V0 to V63. This enables generation of a grayscale voltage having grayscale characteristics (?-correction characteristics) optimum for the display panel. In the case of performing a polarity reversal drive, a positive ladder resistor circuit and a negative ladder resistor circuit may be provided in the select voltage generation circuit 112. The resistance value of each resistor element of the ladder resistor circuit may be changed based on the adjustment data set in the adjustment register 116. An impedance conversion circuit (voltage-follower-connected operational amplifier) may be provided in the select voltage generation circuit 112 or the grayscale voltage select circuit 114.

Figure 10A:
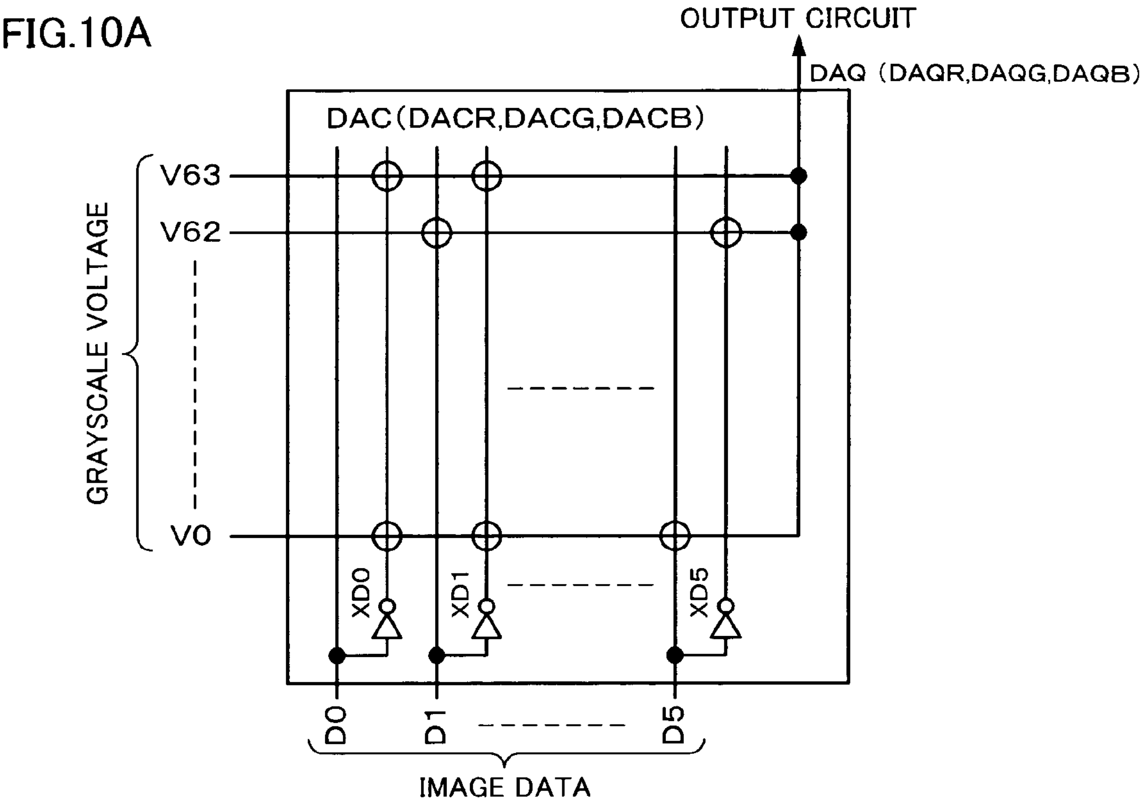
FIGS. 10A to 10C are configuration examples of a D/A conversion circuit and an output circuit.

FIG. 10A shows a configuration example of a digital-analog converter (DAC) included in the D/A conversion circuit 54 shown in FIG. 8A. The DAC shown in FIG. 10A may be provided in subpixel units (or pixel units), and may be formed by a ROM decoder and the like. The DAC selects one of the grayscale voltages V0 to V63 from the grayscale voltage generation circuit 110 based on 6-bit digital image data D0 to D5 and inverted data XD0 to XD5 from the memory 20 to convert the image data D0 to D5 into an analog voltage. The DAC outputs the resulting analog voltage signal DAQ (DAQR, DAQG, DAQB) to the output circuit 56.

When R, G, and B data signals are multiplexed and supplied to a low-temperature polysilicon TFT display driver or the like (FIG. 10C), R, G, and B image data may be D/A converted by using one common DAC. In this case, the DAC shown in FIG. 10A is provided in pixel units.

Figure 10B:
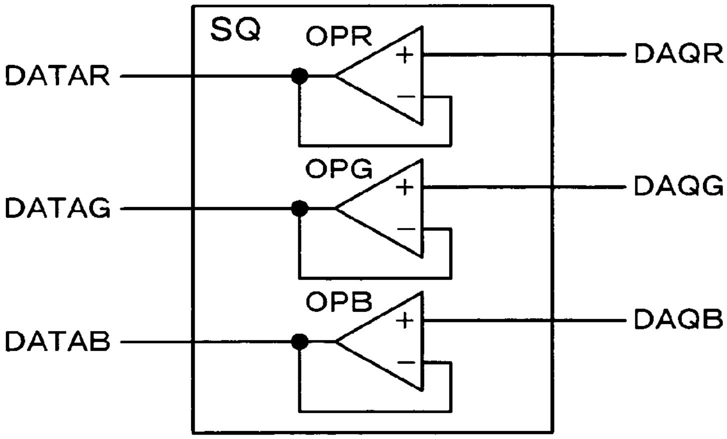
Figure 10C:
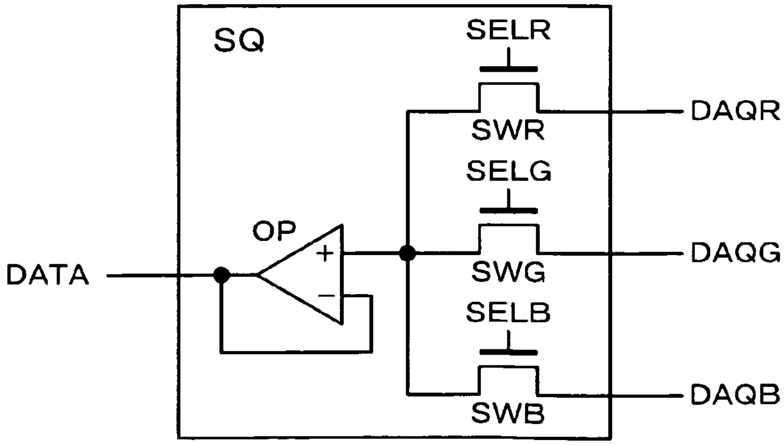

FIG. 10B shows a configuration example of an output section SQ included in the output circuit 56 shown in FIG. 8A. The output section SQ shown in FIG. 10B may be provided in pixel units. The output section SQ includes R (red), G (green), and B (blue) impedance conversion circuits OPR, OPG, and OPB (voltage-follower-connected operational amplifiers), performs impedance conversion of the signals DAQR, DAQG, and DAQB from the DAC, and outputs data signals DATAR, DATAG, and DATAB to R, G, and B data signal output lines. When using a low-temperature polysilicon TFT panel, switch elements (switch transistors) SWR, SWG, and SWB as shown in FIG. 10C may be provided, and the impedance conversion circuit OP may output a data signal DATA in which the R, G, and B data signals are multiplexed. The data signals may be multiplexed over a plurality of pixels. Only the switch elements and the like may be provided in the output section SQ without providing the impedance conversion circuit as shown in FIGS. 10B and 10C.

Figure 11:
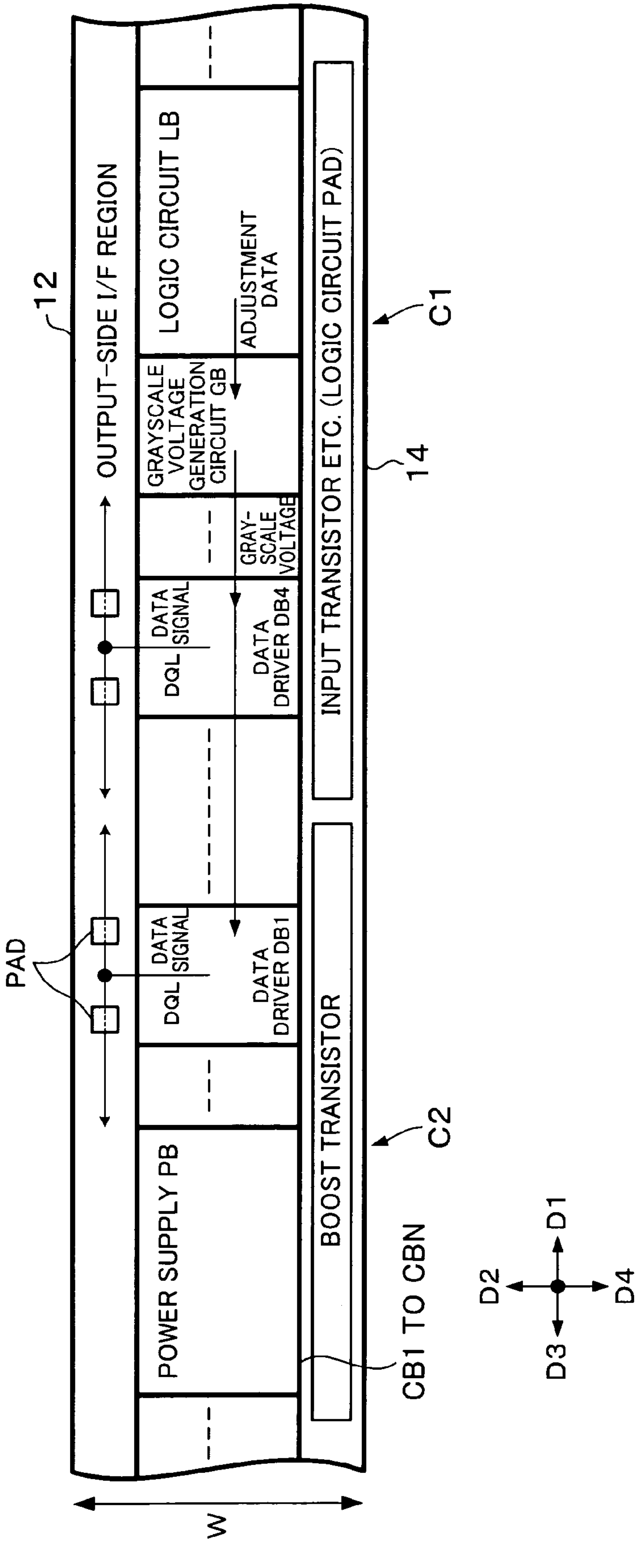
FIG. 11 is a diagram illustrative of an arrangement method for a logic circuit block, a grayscale voltage generation circuit block, a power supply circuit block, and a data driver block.

4. Arrangement of Logic Circuit Block, Grayscale Voltage Generation Circuit Block, Data Driver Block, and Power Supply Circuit Block 4.1 Arrangement of Data Driver Block In the embodiment, as shown in FIG. 11, the circuit blocks CB1 to CBN include a logic circuit block LB which sets grayscale characteristic adjustment data, and a grayscale voltage generation circuit block GB which generates grayscale voltages based on the set adjustment data. The circuit blocks CB1 to CBN also include the data driver blocks DB1 to DB4 (at least one data driver block in a broad sense) for driving the data lines based on the grayscale voltages received from the grayscale voltage generation circuit block GB, and a power supply circuit block PB which generates the power supply voltage. In the embodiment, the data driver blocks DB1 to DB4 are disposed between the logic circuit block LB and the grayscale voltage generation circuit block GB, and the power supply circuit block PB.

According to the arrangement shown in FIG. 11, the logic circuit block LB, the grayscale voltage generation circuit block GB, and the power supply circuit block PB having a relatively large circuit area are disposed on either side of the data driver blocks DB1 to DB4. Therefore, logic circuit pads and input transistors formed under the pads can be disposed by utilizing the free space (space indicated by C1) on the D4 side of the logic circuit block LB and the grayscale voltage generation circuit block GB. Moreover, power supply circuit voltage booster transistors having a large size and the like can be disposed by utilizing the free space (space indicated by C2) on the D4 side of the power supply circuit block PB. According to the arrangement shown in FIG. 11, since the data driver blocks DB1 to DB4 can be concentrated and disposed near the center of the integrated circuit device, the data signal output lines from the data driver blocks DB1 to DB4 can be efficiently and simply disposed in the output-side I/F region 12. Therefore, the interconnect efficiency and the arrangement efficiency in the output-side I/F region 12 and the input-side I/F region 14 can be increased so that the width W of the integrated circuit device in the direction D2 can be reduced, whereby a slim integrated circuit device can be realized.

According to the arrangement shown in FIG. 11, output lines for the grayscale voltage generated by the grayscale voltage generation circuit block GB based on the adjustment data from the logic circuit block LB can be efficiently disposed by utilizing a global line or the like and can be connected with the data driver blocks DB1 to DB4. Therefore, the interconnect efficiency can be increased so that the width of the circuit blocks CB1 to CBN in the direction D2 can be reduced, whereby a slim integrated circuit device can be realized.

In FIG. 11, the logic circuit block LB and the grayscale voltage generation circuit block GB are disposed adjacent to each other along the direction D1. The reasons therefore are as follows.

Figure 12:
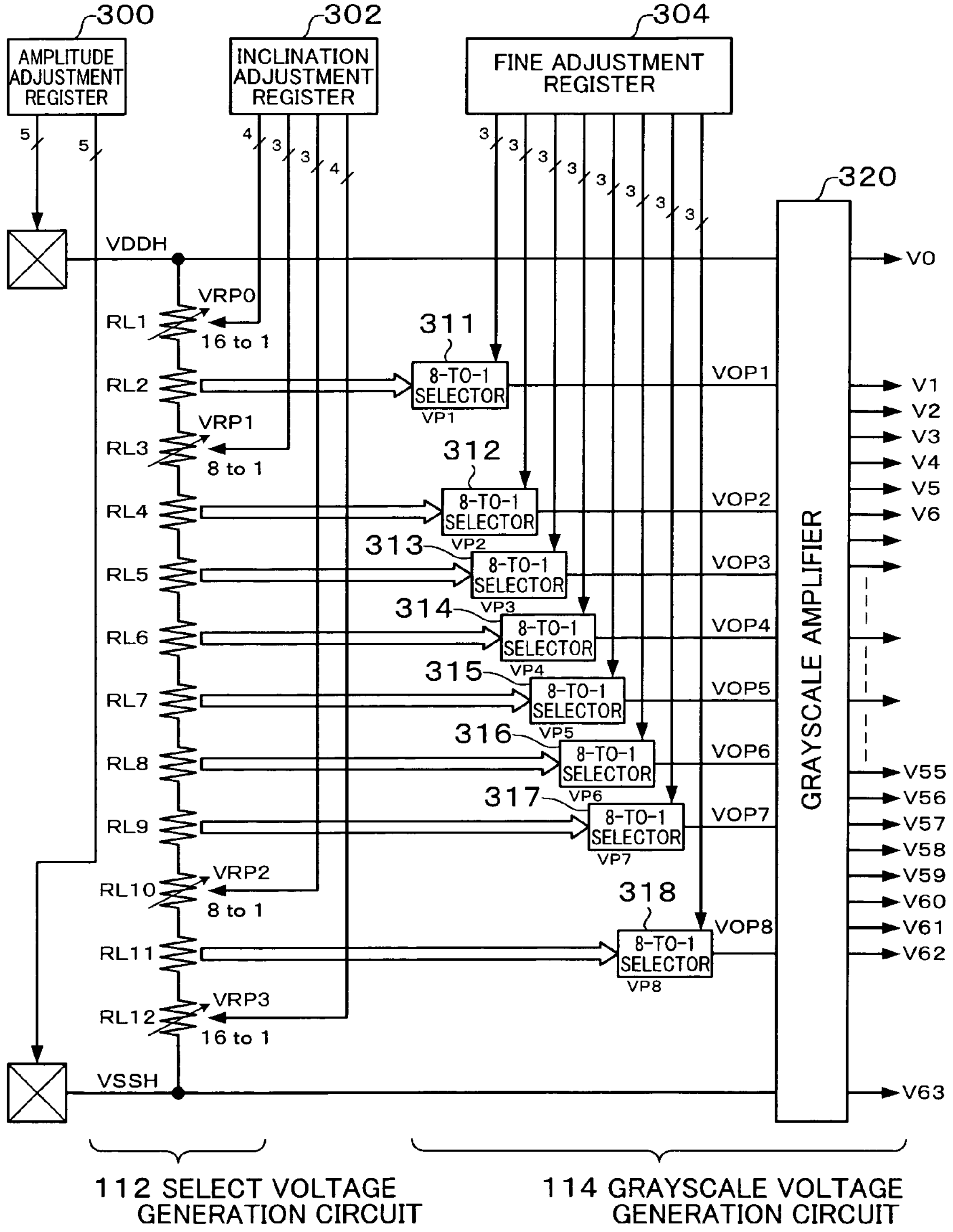
FIG. 12 is a detailed circuit configuration example of the grayscale voltage generation circuit block.
Figure 13A:
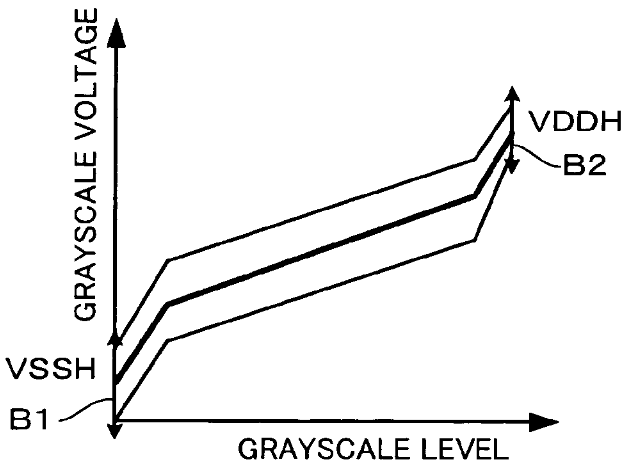
FIGS. 13A to 13C are diagrams illustrative of adjustment of grayscale characteristics.
Figure 13B:
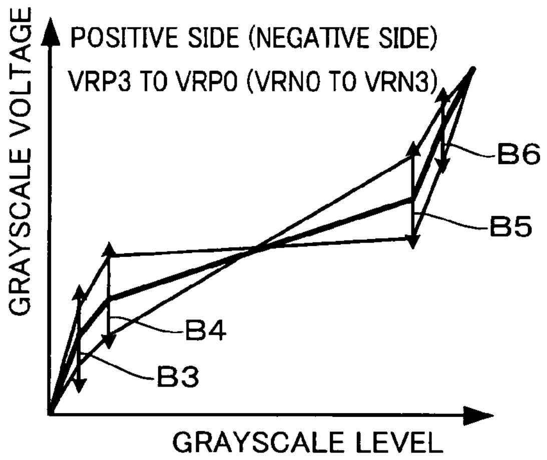
Figure 13C:
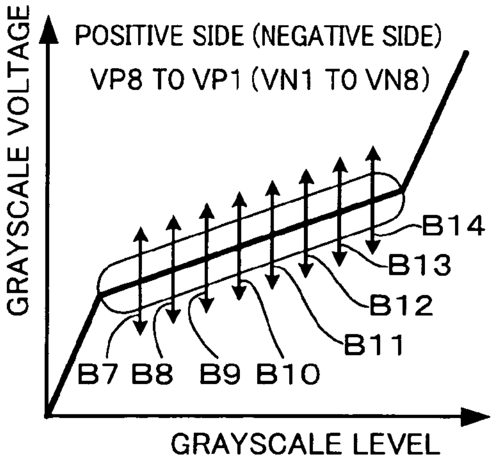

FIG. 12 shows a detailed circuit configuration example of the grayscale voltage generation circuit block GB. FIG. 12 shows a circuit for positive polarity. However, a circuit for negative polarity may be realized by using a similar configuration. The grayscale characteristic adjustment data is set in an amplitude adjustment register 300, an inclination adjustment register 302, and a fine adjustment register 304. The adjustment data is set (written) by the logic circuit block LB. For example, the voltage levels of the power supply voltages VDDH and VSSH are changed as indicated by B1 and B2 in FIG. 13A by setting the adjustment data in the amplitude adjustment register 300 so that the amplitude of the grayscale voltage can be adjusted. The grayscale voltage is changed at four points of the grayscale level as indicated by B3 to B6 in FIG. 13B by setting the adjustment data in the inclination adjustment register 302 so that the inclination of the grayscale characteristics can be adjusted. Specifically, the resistance value of a resistor element RL12 of a resistance ladder is changed based on 4-bit adjustment data VRP3 set in the inclination adjustment register 302 so that the inclination can be adjusted as indicated by B3. This also applies to adjustment data VRP2 to VRP0. The grayscale voltages are changed at eight points of the grayscale levels as indicated by B7 to B14 in FIG. 13C by setting the adjustment data in the fine adjustment register 304 so that the grayscale characteristics can be finely adjusted. Specifically, an 8-to-1 selector 318 selects one of eight taps of a resistor element RL11 based on 3-bit adjustment data VP8 set in the fine adjustment register 304, and outputs the voltage of the selected tap as an output VOP8. This enables fine adjustment as indicated by B7 in FIG. 13C. This also applies to adjustment data VP7 to VP1.

A grayscale amplifier section 320 outputs the grayscale voltages V0 to V63 based on the outputs VOP1 to VOP8 from the 8-to-1 selectors 311 to 318 and the power supply voltages VDDH and VSSH. In more detail, the grayscale amplifier section 320 includes first to eighth impedance conversion circuits (voltage-follower-connected operational amplifiers) to which the outputs VOP1 to VPOP8 are input. The grayscale voltages V1 to V62 are generated by dividing the output voltages of adjacent impedance conversion circuits of the first to eighth impedance conversion circuits by using resistors, for example.

The grayscale characteristics (?-characteristics) optimum corresponding to the type of display panel can be obtained by the above-described adjustment, whereby the display quality can be improved.

However, the number of bits of adjustment data for performing such an adjustment is very large, as shown in FIG. 12. Therefore, the number of adjustment data signal lines from the logic circuit block LB to the grayscale voltage generation circuit block GB is also large. As a result, if the logic circuit block LB and the grayscale voltage generation circuit block GB are not disposed adjacent to each other, the chip area may be increased due to the interconnect region for the adjustment data signal lines.

In the embodiment, the logic circuit block LB and the grayscale voltage generation circuit block GB are disposed adjacent to each other along the direction D1, as shown in FIG. 11. This enables the adjustment data signal lines from the logic circuit block LB to be connected with the grayscale voltage generation circuit block GB along a short path, whereby an increase in the chip area due to the interconnect region can be prevented.

As a comparative example of the embodiment, the grayscale voltage generation circuit block GB and the logic circuit block LB may be disposed adjacent to each other along the direction D2. However, according to the method of the comparative example, since two circuit blocks are stacked (disposed) in the direction D2, the width of the integrated circuit device in the direction D2 is increased. Moreover, when the circuit configuration of one of the circuit blocks stacked in the direction D2 is changed corresponding to the number of pixels or the type of display panel, the specification of the display driver, or the like so that the width in the direction D2 or the length in the direction D1 of the circuit block is changed, the other circuit block is affected by such a change, whereby the design efficiency is decreased.

In the embodiment, the grayscale voltage generation circuit block GB and the logic circuit block LB are disposed along the direction D1. Therefore, since the width W of the integrated circuit device in the direction D2 can be reduced, a slim chip as shown in FIG. 2B can be realized. Moreover, when the circuit configuration of one of the adjacent circuit blocks is changed corresponding to the type of display panel or the like, it suffices to adjust the length of the circuit block in the direction D1, for example. Therefore, the circuit block can be prevented from being affected by the other circuit block, whereby the design efficiency can be improved.

In FIG. 11, the grayscale voltage generation circuit block GB is disposed between the data driver blocks DB1 to DB4 and the logic circuit block LB.

Specifically, the adjustment data signal lines are disposed between the grayscale voltage generation circuit block GB and the logic circuit block LB in FIG. 11, and the number of adjustment data signal lines is large as described with reference to FIG. 12. The grayscale voltage generation circuit block GB must output the grayscale voltages to the data driver block DB, and the number of grayscale voltage output lines is very large. Therefore, if the grayscale voltage generation circuit block GB is not disposed between the data driver block DB and the logic circuit block LB but is disposed on the D1 side of the logic circuit block LB in FIG. 11, not only the adjustment data signal lines but also the grayscale voltage output lines must be disposed between the grayscale voltage generation circuit block GB and the logic circuit block LB. This makes it difficult to dispose other signal lines and power supply lines between the grayscale voltage generation circuit block GB and the logic circuit block LB by using a global line or the like, whereby the interconnect efficiency is decreased.

On the other hand, since the grayscale voltage generation circuit block GB is disposed between the data driver block DB and the logic circuit block LB in FIG. 11, the grayscale voltage output lines need not be disposed between the grayscale voltage generation circuit block GB and the logic circuit block LB. Therefore, other signal lines and power supply lines can be disposed between the grayscale voltage generation circuit block GB and the logic circuit block LB by using a global line or the like, whereby the interconnect efficiency can be increased.

In the embodiment, the data signal output line DQL from the data driver block DB is disposed in the data driver block DB along the direction D2, as shown in FIG. 11. On the other hand, the data signal output line DQL is disposed in the output-side I/F region 12 (first interface region) along the direction D1 (D3). In more detail, the data signal output line DQL is disposed in the output-side I/F region 12 along the direction D1 by using the global line located in the lower layer of the pad and in the upper layer of the local line (transistor interconnect) inside the output-side I/F region 12. This enables the data signal from the data driver block DB to be properly output to the display panel through the pad by efficiently disposing the signal lines for the adjustment data, the grayscale voltage, and the data signal as shown in FIG. 11. Moreover, if the data signal output line DQL is disposed as shown in FIG. 11, the data signal output line DQL can be connected with the pads or the like by utilizing the output-side I/F region 12, whereby an increase in the width W of the integrated circuit device in the direction D2 can be prevented.

In FIG. 11, the logic circuit block LB and the grayscale voltage generation circuit block GB are disposed adjacent to each other. However, a modification is also possible in which the logic circuit block LB is not disposed adjacent to the grayscale voltage generation circuit block GB. A modification is also possible in which the grayscale voltage generation circuit block GB is not disposed between the logic circuit block LB and the data driver blocks DB1 to DB4. The grayscale voltage generation circuit block GB and the data driver block DB4 may be or may not be disposed adjacent to each other. In addition, the power supply circuit block PB and the data driver block DB1 may be or may not be disposed adjacent to each other.

4.2 Arrangement of Scan Driver Block

Figure 14A:
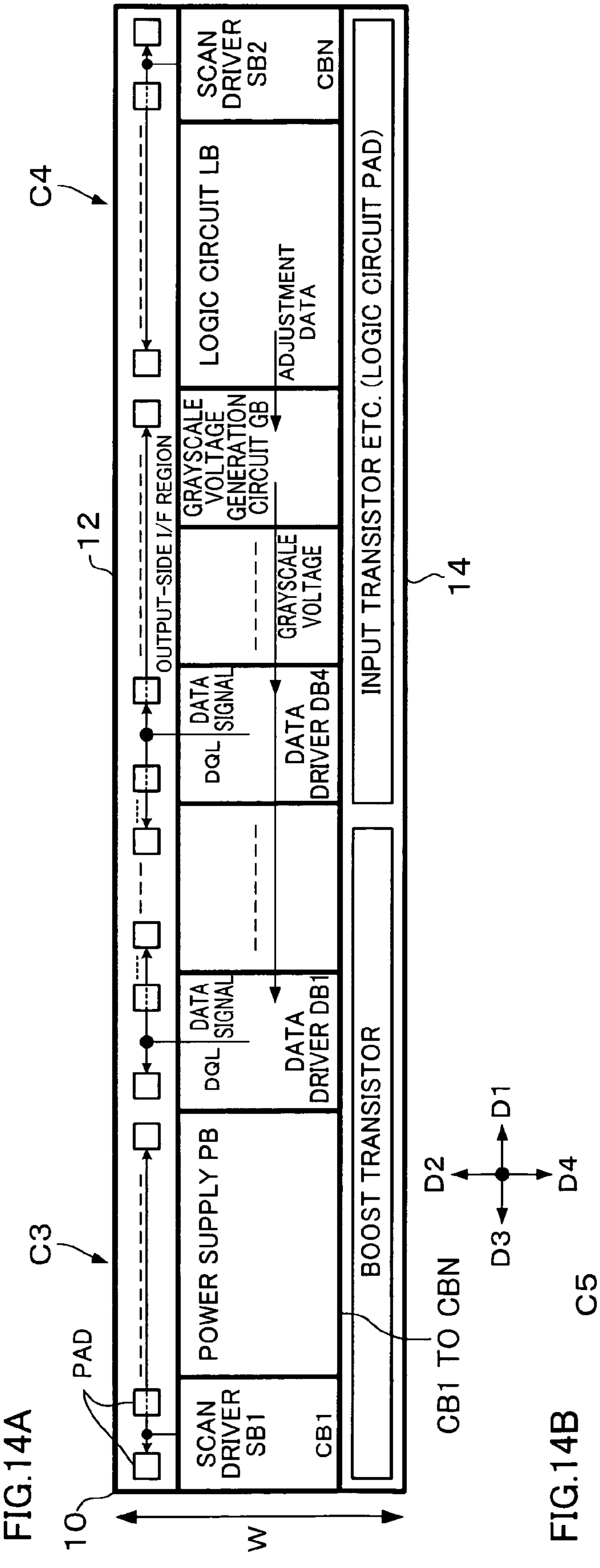
FIGS. 14A and 14B are arrangement examples of a scan driver block.

In FIG. 14A, the circuit blocks CB1 to CBN include a first scan driver block SB1 and a second scan driver block SB2 for driving the scan lines. In more detail, the first scan driver block SB1 is disposed as the first circuit block CB1 (circuit block on the SD1 side) of the circuit blocks CB1 to CBN. The second scan driver block SB2 is disposed as the Nth circuit block CBN (circuit block on the SD3 side) of the circuit blocks CB1 to CBN.

In FIG. 14A, the power supply circuit block PB is disposed between the scan driver block SB1 and the data driver blocks DB1 to DB4. The logic circuit block LB and the grayscale voltage generation circuit block GB are disposed between the scan driver block SB2 and the data driver blocks DB1 to DB4.

If the scan driver blocks SB1 and SB2 are disposed as the circuit blocks CB1 and CBN positioned on either end of the integrated circuit device 10 as shown in FIG. 14A, a first scan signal group from the scan driver block SB1 can be input from the left of the display panel, and a second scan signal group from the scan driver block SB2 can be input from the right of the display panel, for example. This realizes efficient mounting, comb-tooth drive of the display panel, and the like.

When disposing the scan driver blocks SB1 and SB2 on either end of the integrated circuit device 10 as shown in FIG. 14A, it is preferable to dispose the scan signal output pads on each end of the output-side I/F region 12 taking the interconnect efficiency into consideration. In FIG. 14A, the data driver blocks DB1 to DB4 are disposed near the center of the integrated circuit device 10. Therefore, it is preferable to dispose the data signal output pads near the center of the output-side I/F region 12 taking the interconnect efficiency into consideration.

If the power supply circuit block PB and the logic circuit block LB having a relatively large circuit area are disposed on either end of the data driver blocks DB1 to DB4 as shown in FIG. 14A, the scan signal output pads and the output transistors formed under the pads can be disposed by utilizing the free space (space indicated by C3 and C4) on the D2 side of the power supply circuit block PB and the logic circuit block LB. Therefore, the interconnect efficiency in the output-side I/F region 12 can be increased so that the width W of the integrated circuit device 10 in the direction D2 can be reduced, whereby a slim integrated circuit device 10 can be realized.

In FIG. 14A, the logic circuit block LB and the scan driver block SB2 are disposed adjacent to each other along the direction D1. Specifically, since the circuit block of the circuit blocks CB1 to CBN to which the signal lines are connected from the scan driver block SB2 is only the logic circuit block LB, the logic circuit block LB and the scan driver block SB2 are disposed adjacent to each other. However, a modification is also possible in which the logic circuit block LB and the scan driver block SB2 are not disposed adjacent to each other. In FIG. 14A, it is preferable to supply the high-voltage power supply (20 V or −20 V) generated by the power supply circuit block PB to the scan driver block SB2 by using an interconnect formed in the output-side I/F region 12 along the direction D1. This minimizes the adverse effects of the high-voltage power supply interconnect on the remaining circuit blocks.

Figure 14B:
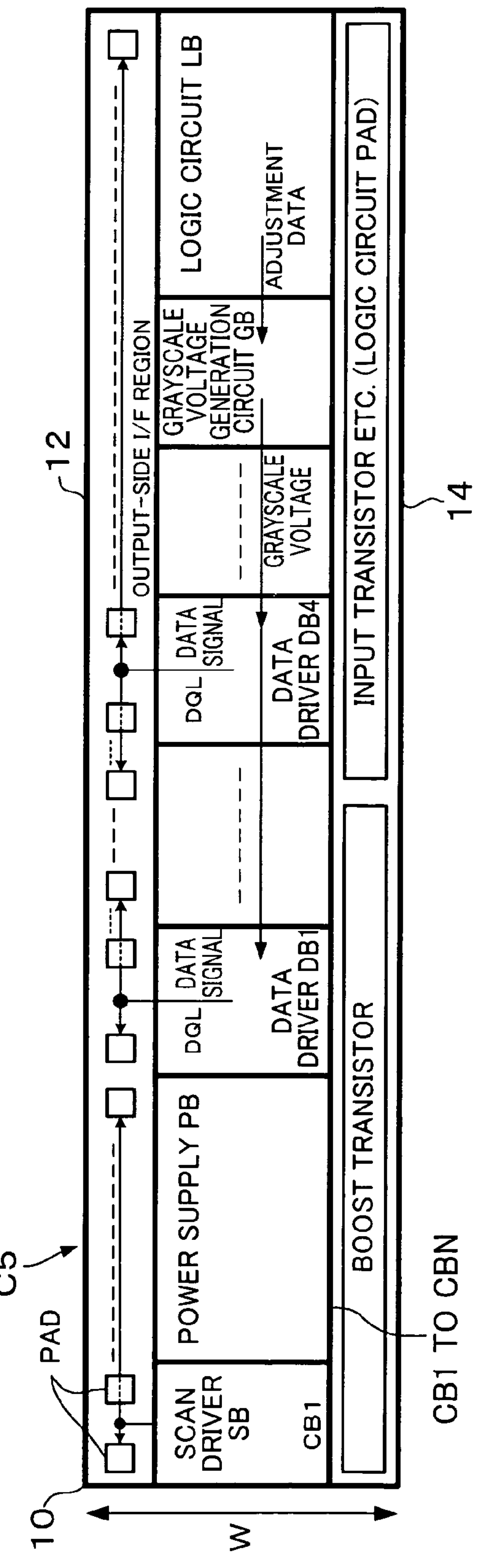

In FIG. 14B, the circuit blocks CB1 to CBN include the scan driver block SB for driving the scan lines. In more detail, the scan driver block SB is disposed as the first circuit block CB1 of the circuit blocks CB1 to CBN. In FIG. 14B, the power supply circuit block PB is disposed between the scan driver block SB and the data driver block DB. The direction D1 in the embodiment need not be the right direction, but may be the left direction. The first circuit block CB1 (scan driver block SB) need not be the circuit block on the left end of the integrated circuit device 10, but may be the circuit block on the right end.

If the power supply circuit block PB or the like having a relatively large circuit area is disposed as shown in FIG. 14B, the scan signal output pads and the output transistors formed under the pads can be disposed by utilizing the free space (space indicated by C5) on the D2 side of the power supply circuit block PB or the like. Therefore, the interconnect efficiency in the output-side I/F region 12 can be increased so that the width W of the integrated circuit device 10 in the direction D2 can be reduced, whereby a slim integrated circuit device 10 can be realized.

In FIG. 14B, the scan driver block SB and the power supply circuit block PB are disposed adjacent to each other along the direction D1. Specifically, it is necessary to supply the high-voltage (e.g. 20 V or −20 V) power supply generated by the power supply circuit block PB (voltage booster circuit) to the scan driver block SB. A high-voltage power supply interconnect can be provided along a short path by disposing the scan driver block SB (SB1) and the power supply circuit block PB adjacent to each other, whereby adverse effects caused by noise occurring from the high-voltage power supply interconnect can be minimized.

The number of interconnects which connect the scan driver block SB with other circuit blocks (e.g. power supply circuit block PB and logic circuit block LB) is small. However, the number of interconnects provided between the scan driver block SB and the output-side I/F region 12 is very large. Specifically, it is necessary to connect many output signal lines from the scan driver block SB with the pads of the output-side I/F region 12 or output transistors formed under the pads. The scan signal output pads can be disposed in the free space (space indicated by C5) which exists in the output-side I/F region 12 on the D2 side of the power supply circuit block PB by disposing the scan driver block SB and the power supply circuit block PB adjacent to each other along the direction D1. As a result, many output signal lines from the scan driver block SB can be connected with the pads or the output transistors formed under the pads. Therefore, the interconnect efficiency in the output-side I/F region 12 can be increased so that the width W of the integrated circuit device 10 in the direction D2 can be reduced, whereby a slim integrated circuit device 10 can be realized.

A modification is also possible in which another circuit block is provided between the scan driver block SB (SB1) and the power supply circuit block PB. In this case, the power supply circuit block PB is disposed at least between the scan driver block SB (SB1) and, the grayscale voltage generation circuit block GB and the logic circuit block LB (data driver block).

4.3 Details of Arrangement of Grayscale Voltage Generation Circuit Block

Figure 15A:
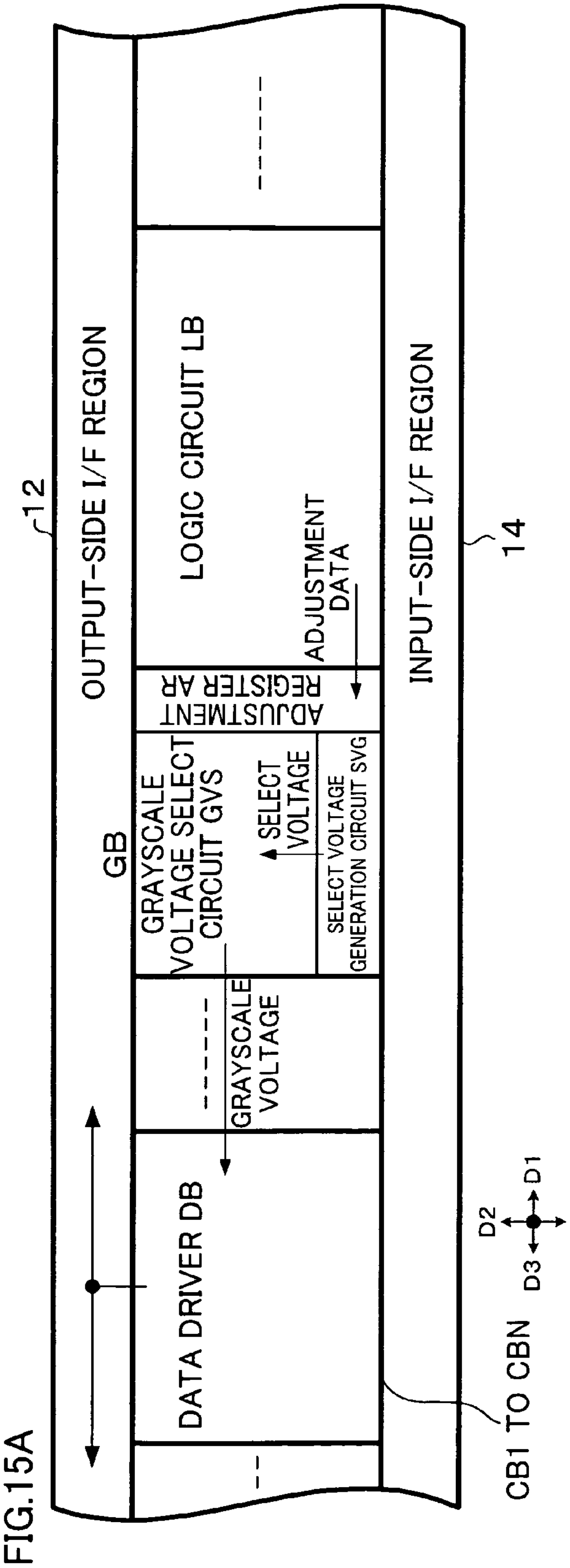
FIGS. 15A and 15B are detailed arrangement examples of the grayscale voltage generation circuit block.

As shown in FIG. 15A, the grayscale voltage generation circuit block GB includes a select voltage generation circuit SVG (voltage divider circuit) which outputs select voltages (divided voltages) based on the power supply voltage. The grayscale voltage generation circuit block GB includes a grayscale voltage select circuit GVS which selects and outputs the grayscale voltages based on the adjustment data set by the logic circuit block LB and the select voltages. The grayscale voltage generation circuit block GB also includes an adjustment register AR for setting the adjustment data. The adjustment register AR may be included in the logic circuit block LB.

In FIG. 15A, the select voltage generation circuit SVG is disposed on the D4 side of the grayscale voltage select circuit GVS. The select voltage generation circuit SVG may be disposed on the D2 side of the grayscale voltage select circuit GVS. The grayscale voltage select circuit GVS is disposed between the data driver block DB and the logic circuit block LB.

According to the arrangement shown in FIG. 15A, the grayscale voltage select circuit GVS receives the adjustment data from the logic circuit block LB disposed on the D1 side of the grayscale voltage select circuit GVS through the adjustment register AR. The grayscale voltage select circuit GVS receives the select voltages from the select voltage generation circuit SVG disposed on the D4 side of the grayscale voltage select circuit GVS. The grayscale voltage select circuit GVS outputs the grayscale voltages generated based on the adjustment data and the select voltages to the data driver block DB disposed on the D3 side of the grayscale voltage select circuit GVS. Therefore, the signals of the adjustment data, the select voltages, and the grayscale voltages flow efficiently, and the crossing area of the signal lines can be minimized. Moreover, since the signal lines of the adjustment data, the select voltages, and the grayscale voltages can be efficiently disposed by utilizing a global line or the like, the interconnect efficiency can be increased.

Figure 15B:
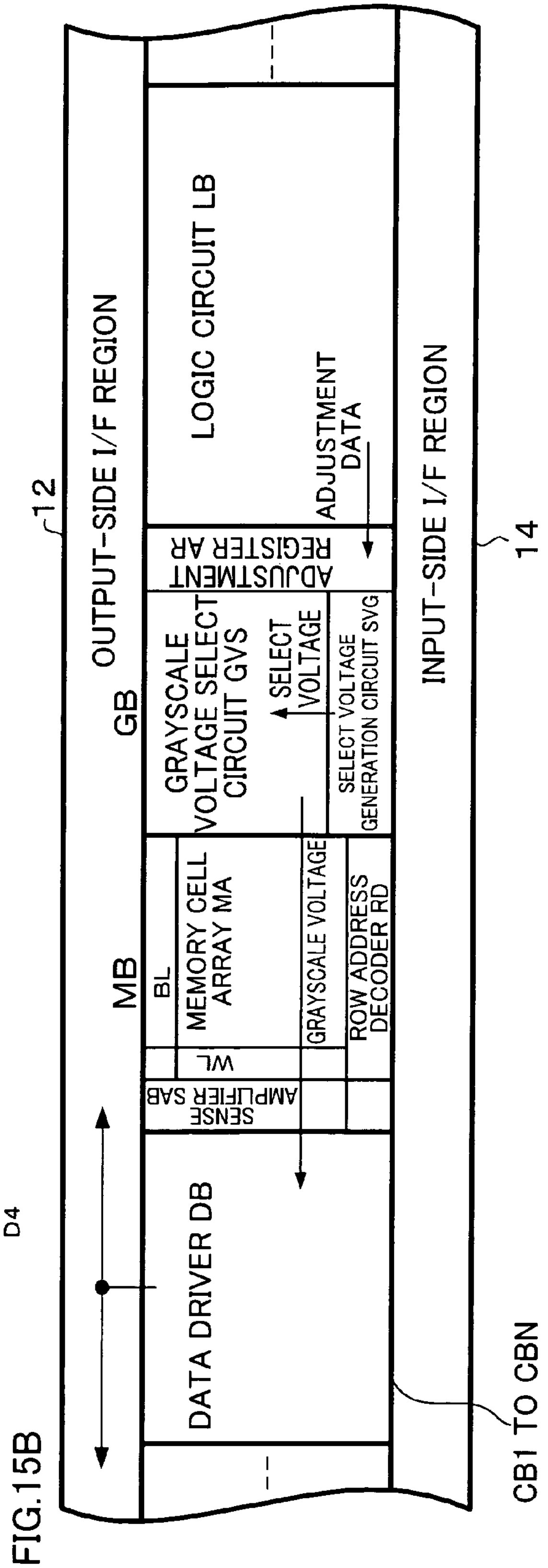

FIG. 15B shows a detailed arrangement example when the integrated circuit device includes a memory. In FIG. 15B, the memory block MB and the data driver block DB are disposed adjacent to each other along the direction D1. The memory block MB is disposed between the data driver block DB and the grayscale voltage generation circuit block GB.

In the comparative example shown in FIG. 1A, the memory block MB and the data driver block DB are disposed along the direction D2 (short side direction) corresponding to the signal flow. Therefore, since the width of the integrated circuit device in the direction D2 is increased, it is difficult to realize a slim chip. Moreover, when the number of pixels of the display panel, the specification of the display driver, the configuration of the memory cell, or the like is changed so that the width in the direction D2 or the length in the direction D1 of the memory block MB or the data driver block DB is changed, the remaining circuit blocks are affected by such a change, whereby the design efficiency is decreased.

In FIG. 15B, since the data driver block DB and the memory block MB are disposed along the direction D1, the width W of the integrated circuit device in the direction D2 can be reduced, whereby a slim chip as shown in FIG. 2B can be realized. Moreover, since it is possible to deal with a change in the number of pixels of the display panel or the like by dividing the memory block, the design efficiency can be improved.

In the comparative example shown in FIG. 1A, since the wordline WL is disposed along the direction D1 (long side direction), a signal delay in the wordline WL is increased, whereby the image data read speed is decreased. In particular, since the wordline WL connected with the memory cells is formed by a polysilicon layer, the signal delay problem is serious. In this case, buffer circuits may be provided between the memory cell arrays in order to reduce the signal delay. However, use of this method increases the circuit scale, whereby cost is increased.

In FIG. 15B, the wordline WL is disposed in the memory block MB along the direction D2 (short side direction), and the bitline BL is disposed along the direction D1 (long side direction). In the embodiment, the width W of the integrated circuit device in the direction D2 is small. Therefore, since the length of the wordline WL in the memory block MB can be reduced, a signal delay in the wordline WL can be significantly reduced in comparison with the comparative example shown in FIG. 1A. Moreover, since it is unnecessary to provide the buffer circuits between the memory cell arrays, the circuit area can also be reduced. In the comparative example shown in FIG. 1A, since the wordline WL, which is long in the direction D1 and has a large parasitic capacitance, is selected even when a part of the access region of the memory is accessed by the host, power consumption is increased. On the other hand, according to the method of dividing the memory into blocks in the direction D1 as in the embodiment, since only the wordline WL of the memory block corresponding to the access region is selected during the host access, a reduction in power consumption can be realized. The wordline WL shown in FIG. 15B is a wordline connected with the memory cells (transfer transistors) of the memory block MB. The bitline BL shown in FIG. 15B is a bitline through which image data stored in the memory block MB is output to the data driver block DB.

5. Details of Memory Block and Data Driver Block 5.1 Block Division

Figure 16A:
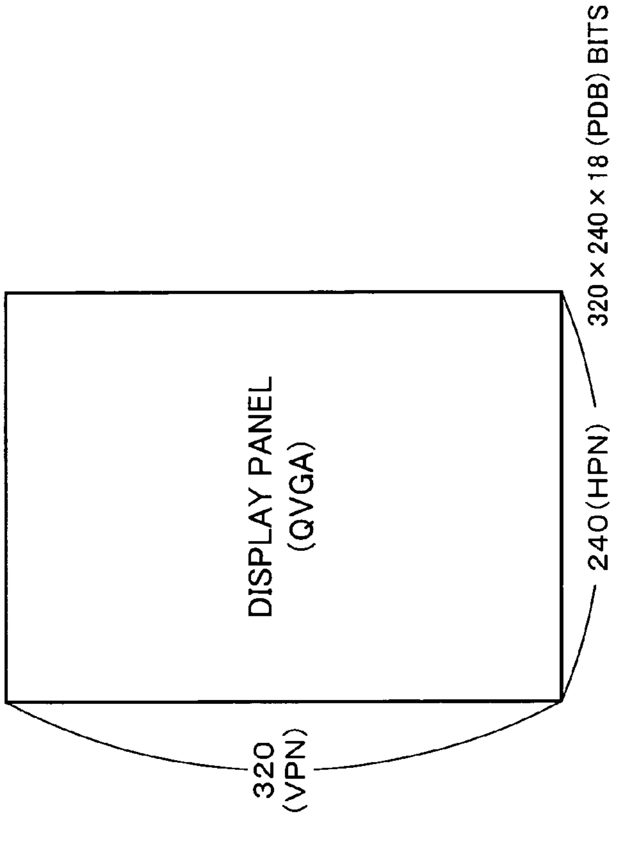
FIGS. 16A and 16B are illustrative of an arrangement of the memory block and the data driver block.

Suppose that the display panel is a QVGA panel in which the number of pixels VPN in the vertical scan direction (data line direction) is 320 and the number of pixels HPN in the horizontal scan direction (scan line direction) is 240, as shown in FIG. 16A. Suppose that the number of bits PDB of image (display) data for one pixel is 18 bits (six bits each for R, G, and B). In this case, the number of bits of image data necessary for displaying one frame of the display panel is "VPN×HPN×PDB=320×240×18" bits. Therefore, the memory of the integrated circuit device stores at least "320×240×18" bits of image data. The data driver outputs data signals for HPN=240 data lines (data signals corresponding to 240×18 bits of image data) to the display panel in one horizontal scan period (period in which one scan line is scanned).

Figure 16B:
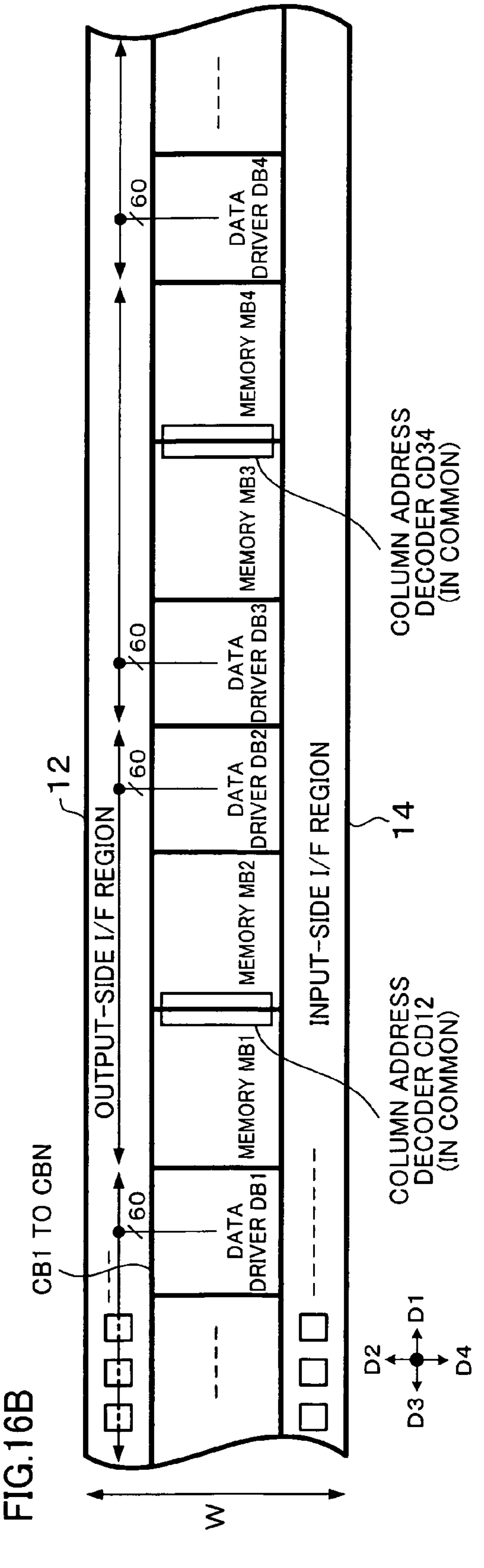

In FIG. 16B, the data driver is divided into four (DBN=4) data driver blocks DB1 to DB4. The memory is also divided into four (MBN=DBN=4) memory blocks MB1 to MB4. Therefore, each of the data driver blocks DB1 to DB4 outputs data signals for 60 (HPN/DBN=240/4=60) data lines to the display panel in one horizontal scan period. Each of the memory blocks MB1 to MB4 stores image data for "(VPN×HPN×PDB)/MBN=(320×240×18)/4" bits. Note that a column address decoder CD12 is used in common by the memory blocks MB1 and MB2, as shown in FIG. 16B, and that a column address decoder CD34 is used in common by the memory blocks MB3 and MB4.

5.2 A Plurality of Readings in One Horizontal Scan Period

In FIG. 16B, each of the data driver blocks DB1 to DB4 outputs data signals for 60 data lines in one horizontal scan period. Therefore, image data corresponding to the data signals for 240 data lines must be read from the data driver blocks DB1 to DB4 corresponding to the data driver blocks DB1 to DB4 in one horizontal scan period.

However, when the number of bits of image data read in one horizontal scan period is increased, it is necessary to increase the number of memory cells (sense amplifiers) arranged in the direction D2. As a result, since the width W of the integrated circuit device in the direction D2 is increased, the width of the chip cannot be reduced. Moreover, since the length of the wordline WL is increased, a signal delay problem in the wordline WL occurs.

In the embodiment, the image data stored in the memory blocks MB1 to MB4 is read from the memory blocks MB1 to MB4 into the data driver blocks DB1 to DB4 a plurality of times (RN times) in one horizontal scan period.

Figure 17:
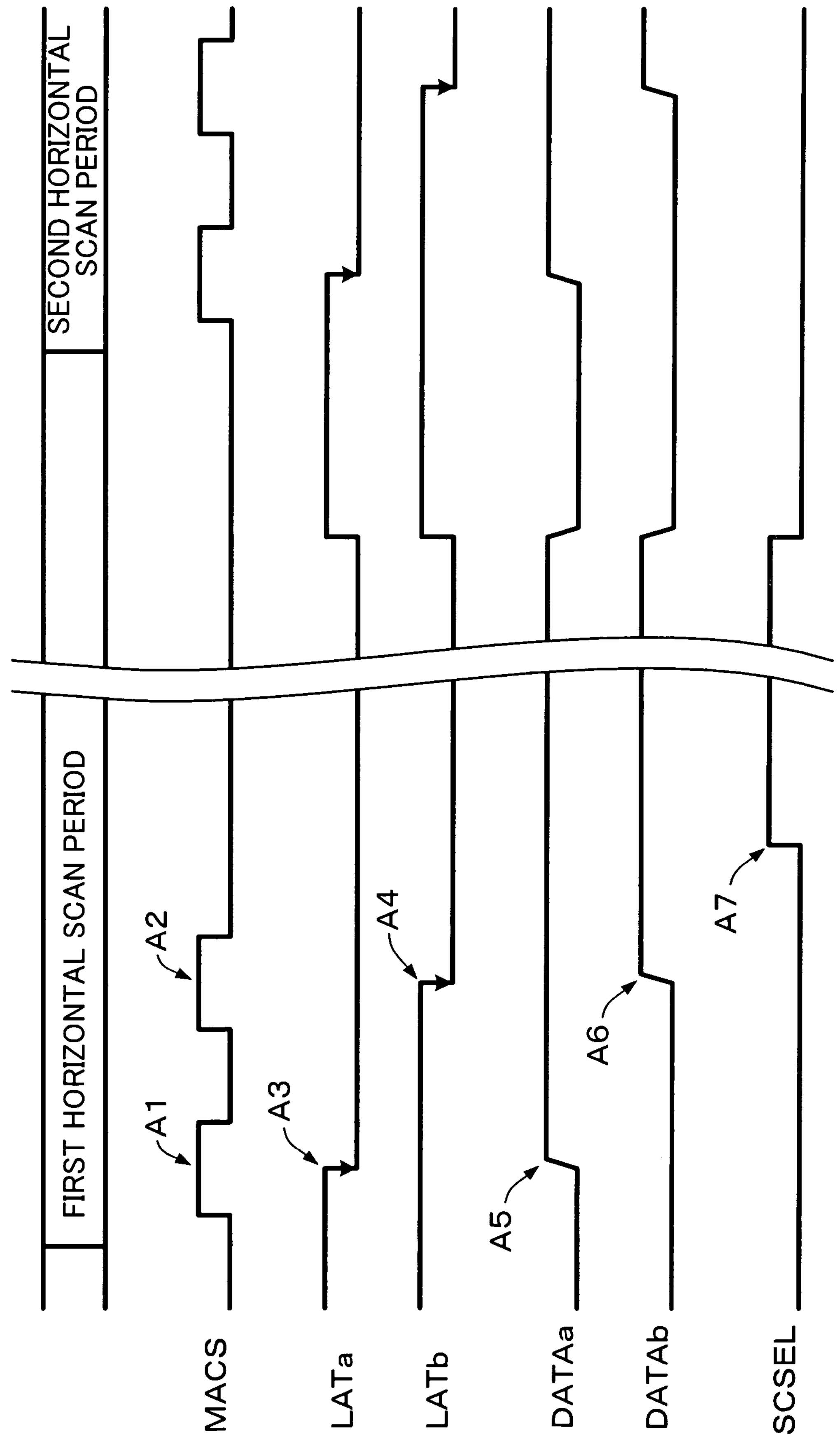
FIG. 17 is illustrative of a method of reading image data a plurality of times in one horizontal scan period.
Figure 18:
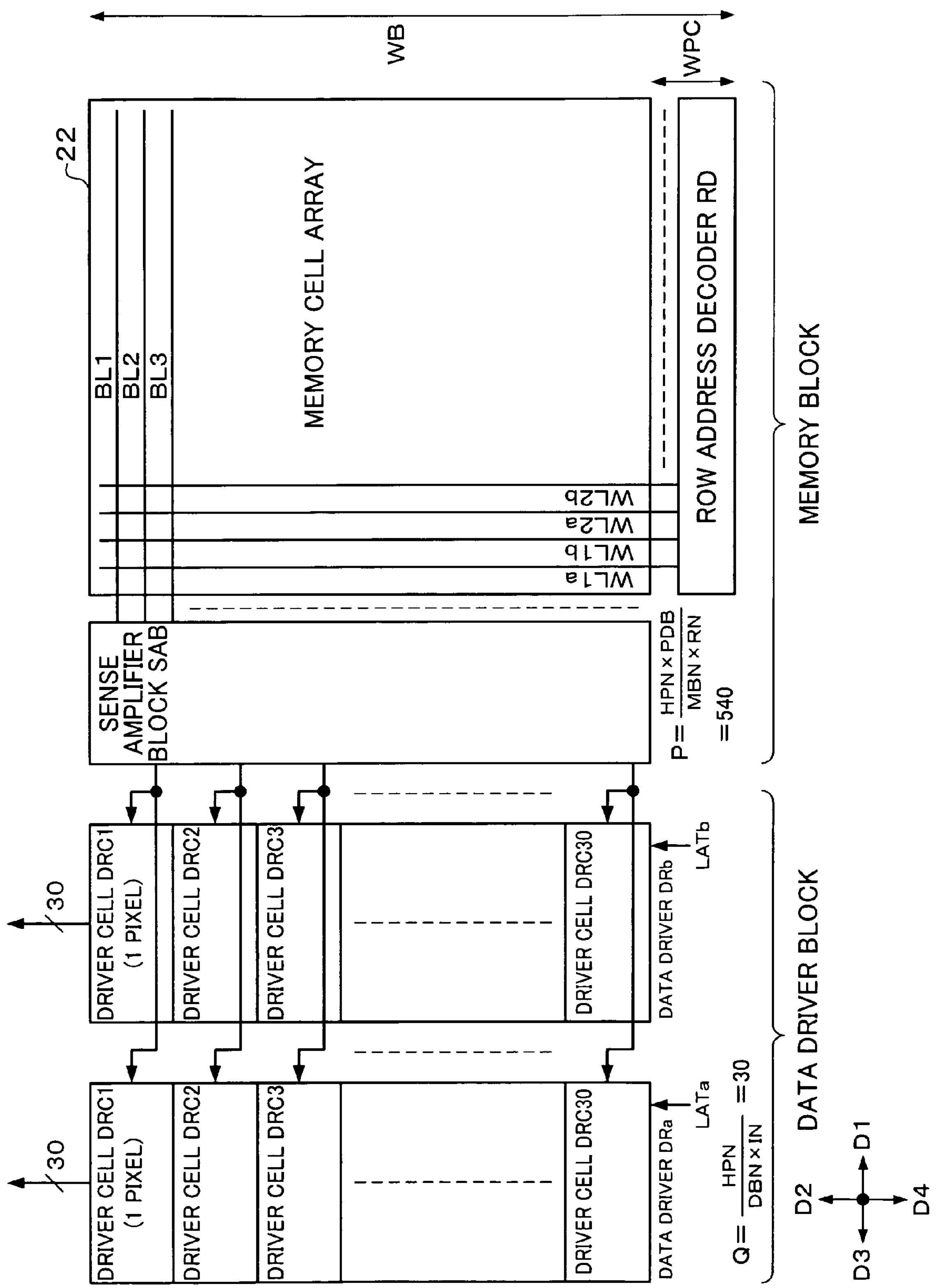
FIG. 18 is an arrangement example of a data driver and a driver cell.

In FIG. 17, a memory access signal MACS (word select signal) goes active (high level) twice (RN=2) in one horizontal scan period as indicated by A1 and A2, for example. This causes the image data to be read from each memory block into each data driver block twice (RN=2) in one horizontal scan period. Then, data latch circuits included in data drivers DRa and DRb shown in FIG. 18 provided in the data driver block latch the read image data based on latch signals LATa and LATb indicated by A3 and A4. D/A conversion circuits included in the data drivers DRa and DRb perform D/A conversion of the latched image data, and output circuits included in the data drivers DRa and DRb output data signals DATAa and DATAb obtained by D/A conversion to the data signal output line as indicated by A5 and A6. A scan signal SCSEL input to the gate of the TFT of each pixel of the display panel goes active as indicated by A7, and the data signal is input to and held by each pixel of the display panel.

In FIG. 17, the image data is read twice in the first horizontal scan period, and the data signals DATAa and DATAb are output to the data signal output line in the first horizontal scan period. However, the image data may be read twice and latched in the first horizontal scan period, and the data signals DATAa and DATAb corresponding to the latched image data may be output to the data signal output line in the second horizontal scan period. FIG. 17 shows the case where the number of readings RN is 2. However, the number of readings RN may be three or more (RN≧3).

According to the method shown in FIG. 17, the image data corresponding to the data signals for 30 data lines is read from each memory block, and each of the data drivers DRa and DRb outputs the data signals for 30 data lines, as shown in FIG. 18. Therefore, the data signals for 60 data lines are output from each data driver block. As described above, it suffices to read the image data corresponding to the data signals for 30 data lines from each memory block in one read operation in FIG. 17. Therefore, the number of memory cells and sense amplifiers in the direction D2 in FIG. 18 can be reduced in comparison with the method of reading the image data only once in one horizontal scan period. As a result, since the width W of the integrated circuit device in the direction D2 can be reduced, a very slim chip as shown in FIG. 2B can be realized. The length of one horizontal scan period is about 52 microseconds in the case of a QVGA display. On the other hand, the memory read time is about 40 nsec, for example, which is sufficiently shorter than 52 microseconds. Therefore, even if the number of readings in one horizontal scan period is increased from once to several times, the display characteristics are not affected to a large extent.

FIG. 16A shows an example of a QVGA (320×240) display panel. However, it is possible to deal with a VGA (640×480) display panel by increasing the number of readings RN in one horizontal scan period to four (RN=4), for example, whereby the degrees of freedom of the design can be increased.

A plurality of readings in one horizontal scan period may be realized by a first method in which the row address decoder (wordline select circuit) selects different wordlines in each memory block in one horizontal scan period, or a second method in which the row address decoder (wordline select circuit) selects a single wordline in each memory block a plurality of times in one horizontal scan period. Or, a plurality of readings in one horizontal scan period may be realized by combining the first method and the second method.

5.3 Arrangement of Data Driver and Driver Cell

FIG. 18 shows an arrangement example of data drivers and driver cells included in the data drivers. As shown in FIG. 18, the data driver block includes a plurality of data drivers DRa and DRb (first to mth data drivers) disposed along the direction D1. Each of the data drivers DRa and DRb includes 30 (Q in a broad sense) driver cells DRC1 to DRC30.

When a wordline WL1*a* of the memory block is selected and the first image data is read from the memory block as indicated by A1 shown in FIG. 17, the data driver DRa latches the read image data based on the latch signal LATa indicated by A3. The data driver DRa performs D/A conversion of the latched image data, and outputs the data signal DATAa corresponding to the first read image data to the data signal output line as indicated by A5.

When a wordline WL1*b* of the memory block is selected and the second image data is read from the memory block as indicated by A2 shown in FIG. 17, the data driver DRb latches the read image data based on the latch signal LATb indicated by A4. The data driver DRb performs D/A conversion of the latched image data, and outputs the data signal DATAb corresponding to the second read image data to the data signal output line as indicated by A6.

As described above, each of the data drivers DRa and DRb outputs the data signals for 30 data lines corresponding to 30 pixels so that the data signals for 60 data lines corresponding to 60 pixels are output in total.

A problem in which the width W of the integrated circuit device in the direction D2 is increased due to an increase in the scale of the data driver can be prevented by disposing (stacking) the data drivers DRa and DRb along the direction D1 as shown in FIG. 18. The data driver is configured in various ways depending on the type of display panel. In this case, the data drivers having various configurations can be efficiently disposed by disposing the data drivers along the direction D1. FIG. 18 shows the case where the number of data drivers disposed in the direction D1 is two. However, the number of data drivers disposed in the direction D1 may be three or more.

In FIG. 18, each of the data drivers DRa and DRb includes 30 (Q) driver cells DRC1 to DRC30 disposed along the direction D2. Each of the driver cells DRC1 to DRC30 receives image data for one pixel. Each of the driver cells DRC1 to DRC30 performs D/A conversion of the image data for one pixel, and outputs a data signal corresponding to the image data for one pixel. Each of the driver cells DRC1 to DRC30 may include a data latch circuit, the DAC (DAC for one pixel) shown in FIG 10A, and the output section SQ shown in FIGS. 10B and 10C.

In FIG. 18, suppose that the number of pixels of the display panel in the horizontal scan direction (the number of pixels in the horizontal scan direction driven by each integrated circuit device when a plurality of integrated circuit devices cooperate to drive the data lines of the display panel) is HPN, the number of data driver blocks (number of block divisions) is DBN, and the number of inputs of image data to the driver cell in one horizontal scan period is IN. The number of inputs IN is equal to the number of readings RN of image data in one horizontal scan period described with reference to FIG. 17. In this case, the number of driver cells DRC1 to DRC30 disposed along the direction D2 may be expressed as "Q=HPN/(DBN×IN)". In FIG. 18, since HPN=240, DBN=4, and IN=2, Q is 30 (240/(4×2)).

When the width (pitch) of the driver cells DRC1 to DR30 in the direction D2 is WD, the width WB (maximum width) of the first to Nth circuit blocks CB1 to CBN in the direction D2 may be expressed as "Q×WD≦WB<(Q+1)×WD". When the width of the peripheral circuit section (e.g. row address decoder RD and interconnect region) included in the memory block in the direction D2 is WPC, "Q×WD≦WB<(Q+1)×WD+WPC" is satisfied.

Suppose that the number of pixels of the display panel in the horizontal scan direction is HPN, the number of bits of image data for one pixel is PDB, the number of memory blocks is MBN (=DBN), and the number of readings of image data from the memory block in one horizontal scan period is RN. In this case, the number (P) of sense amplifiers (sense amplifiers which output one bit of image data) arranged in a sense amplifier block SAB along the direction D2 may be expressed as "P=(HPN×PDB)/(MBN×RN)". In FIG. 18, since HPN=240, PDB=18, MBN=4, and RN=2, P is 540 ((240×18)/(4×2)). The number P is the number of effective sense amplifiers corresponding to the number of effective memory cells, and excludes the number of ineffective sense amplifiers for dummy memory cells and the like.

When the width (pitch) of each sense amplifier included in the sense amplifier block SAB in the direction D2 is WS, the width WSAB of the sense amplifier block SAB (memory block) in the direction D2 may be expressed as "WSAB=P×WS". When the width of the peripheral circuit section included in the memory block in the direction D2 is WPC, the width WB (maximum width) of the circuit blocks CB1 to CBN in the direction D2 may also be expressed as "P×WS≦WB<(P+PDB)×WS+WPC".

5.4 Memory Cell

Figure 19A:
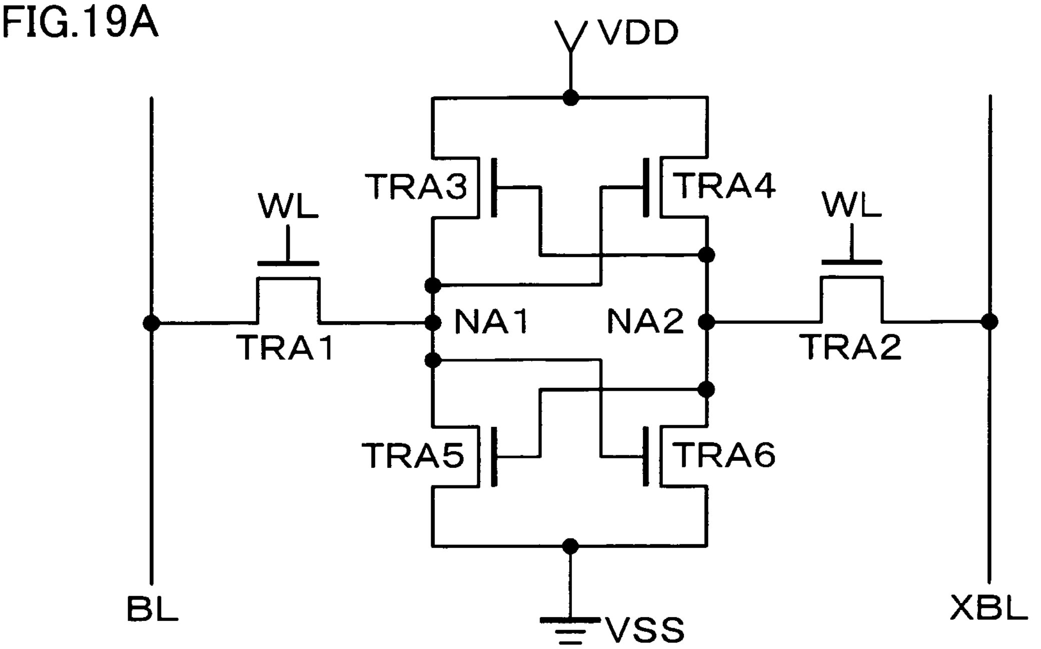
FIGS. 19A to 19C are configuration examples of a memory cell.

FIG. 19A shows a configuration example of the memory cell (SRAM) included in the memory block. The memory cell includes transfer transistors TRA1 and TRA2, load transistors TRA3 and TRA4, and driver transistors TRA5 and TRA6. The transfer transistors TRA1 and TRA2 are turned ON when the wordline WL goes active, so that image data can be written into nodes NA1 and NA2 or read from the nodes NA1 and NA2. The image data written into the memory cell is held at the nodes NA1 and NA2 by using flip-flop circuits formed by the transistors TRA3 to TRA6. The configuration of the memory cell of the embodiment is not limited to the configuration shown in FIG. 19A. Various modifications and variations may be made, such as using resistor elements as the load transistors TRA3 and TRA4 or adding other transistors.

Figure 19B:
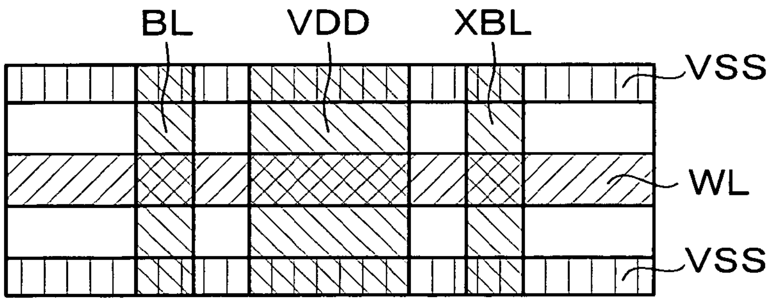
Figure 19C:
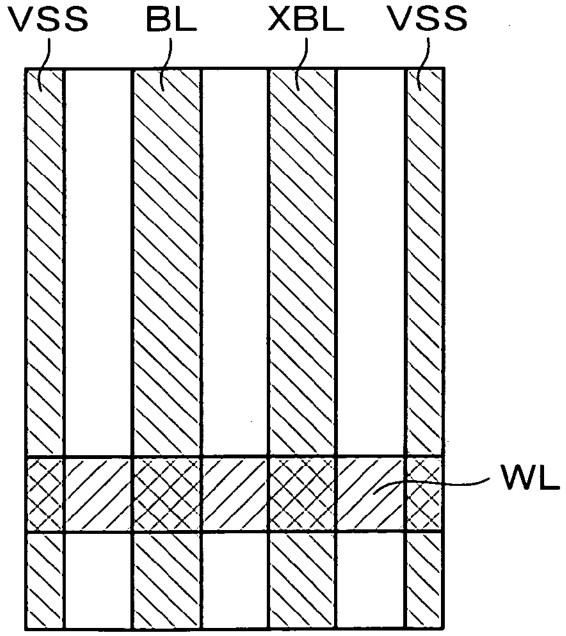

FIGS. 19B and 19C show layout examples of the memory cell. FIG. 19B shows a layout example of a horizontal type cell, and FIG. 19C shows a layout example of a vertical type cell. As shown in FIG. 19B, the horizontal type cell is a cell in which the wordline WL is longer than the bitlines BL and XBL in each memory cell. As shown in FIG. 19C, the vertical type cell is a cell in which the bitlines BL and XBL are longer than the wordline WL in each memory cell. The wordline WL shown in FIG. 19C is a local wordline which is formed by a polysilicon layer and connected with the transfer transistors TRA1 and TRA2. However, a wordline formed by a metal layer may be further provided to prevent a signal delay in the wordline WL and to stabilize the potential of the wordline WL.

Figure 20:
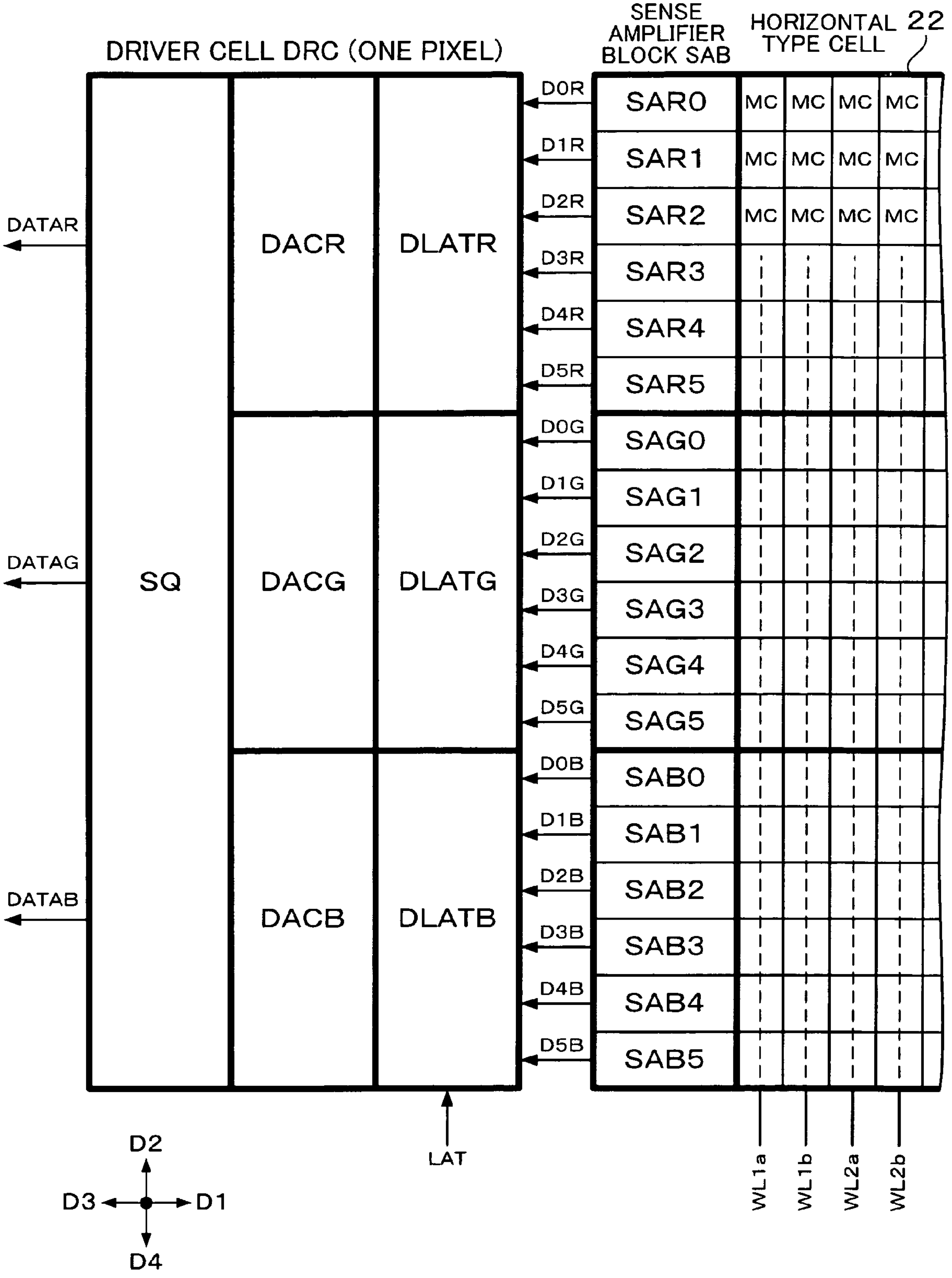
FIG. 20 is an arrangement example of the memory block and the driver cell when using a horizontal type cell.

FIG. 20 shows an arrangement example of the memory block and the driver cell when using the horizontal type cell shown in FIG. 19B as the memory cell. FIG. 20 shows a section of the driver cell and the memory block corresponding to one pixel in detail.

As shown in FIG. 20, the driver cell DRC which receives image data for one pixel includes R (red), G (green), and B (blue) data latch circuits DLATR, DLATG, and DLATB. Each of the data latch circuits DLATR, DLATG, and DLATB latches image data when the latch signal LAT (LATa, LATb) goes active. The driver cell DRC includes the R, G, and B digital-analog converters DACR, DACG, and DACB described with reference to FIG. 10A. The driver cell DRC also includes the output section SQ described with reference to FIGS. 10B and 10C.

A section of the sense amplifier block SAB corresponding to one pixel includes R sense amplifiers SAR0 to SAR5, G sense amplifiers SAG0 to SAG5, and B sense amplifiers SAB0 to SAB5. The bitlines BL and XBL of the memory cells MC arranged along the direction D1 on the D1 side of the sense amplifier SAR0 are connected with the sense amplifier SAR0. The bitlines BL and XBL of the memory cells MC arranged along the direction D1 on the D1 side of the sense amplifier SAR1 are connected with the sense amplifier SAR1. The above description also applies to the relationship between the remaining sense amplifiers and the memory cells.

When the wordline WL1*a* is selected, image data is read from the memory cells MC of which the gate of the transfer transistor is connected with the wordline WL1*a* through the bitlines BL and XBL, and the sense amplifiers SAR0 to SAR5, SAG0 to SAG5, and SAB0 to SAB5 perform the signal amplification operation. The data latch circuit DLATR latches 6-bit R image data D0R to D5R from the sense amplifiers SAR0 to SAR5, the digital-analog converter DACR performs D/A conversion of the latched image data, and the output section SQ outputs the data signal DATAR. The data latch circuit DLATG latches 6-bit G image data D0G to D5G from the sense amplifiers SAG0 to SAG5, the digital-analog converter DACG performs D/A conversion of the latched image data, and the output section SQ outputs the data signal DATAG The data latch circuit DLATB latches 6-bit G image data D0B to D5B from the sense amplifiers SAB0 to SAB5, the digital-analog converter DACB performs D/A conversion of the latched image data, and the output section SQ outputs the data signal DATAB.

In the configuration shown in FIG. 20, the image data can be read a plurality of times in one horizontal scan period shown in FIG. 17 as described below. Specifically, in the first horizontal scan period (first scan line select period), the first image data is read by selecting the wordline WL1*a*, and the first data signal DATAa is output as indicated by A5 shown in FIG. 17. In the first horizontal scan period, the second image data is read by selecting the wordline WL1*b*, and the second data signal DATAb is output as indicated by A6 shown in FIG. 17. In the second horizontal scan period (second scan line select period), the first image data is read by selecting the wordline WL2*a*, and the first data signal DATAa is output. In the second horizontal scan period, the second image data is read by selecting the wordline WL2*b*, and the second data signal DATAb is output. When using the horizontal type cell, the image data can be read a plurality of times in one horizontal scan period by selecting different wordlines (WL1*a* and WL1*b*) in the memory block in one horizontal scan period.

Figure 21:
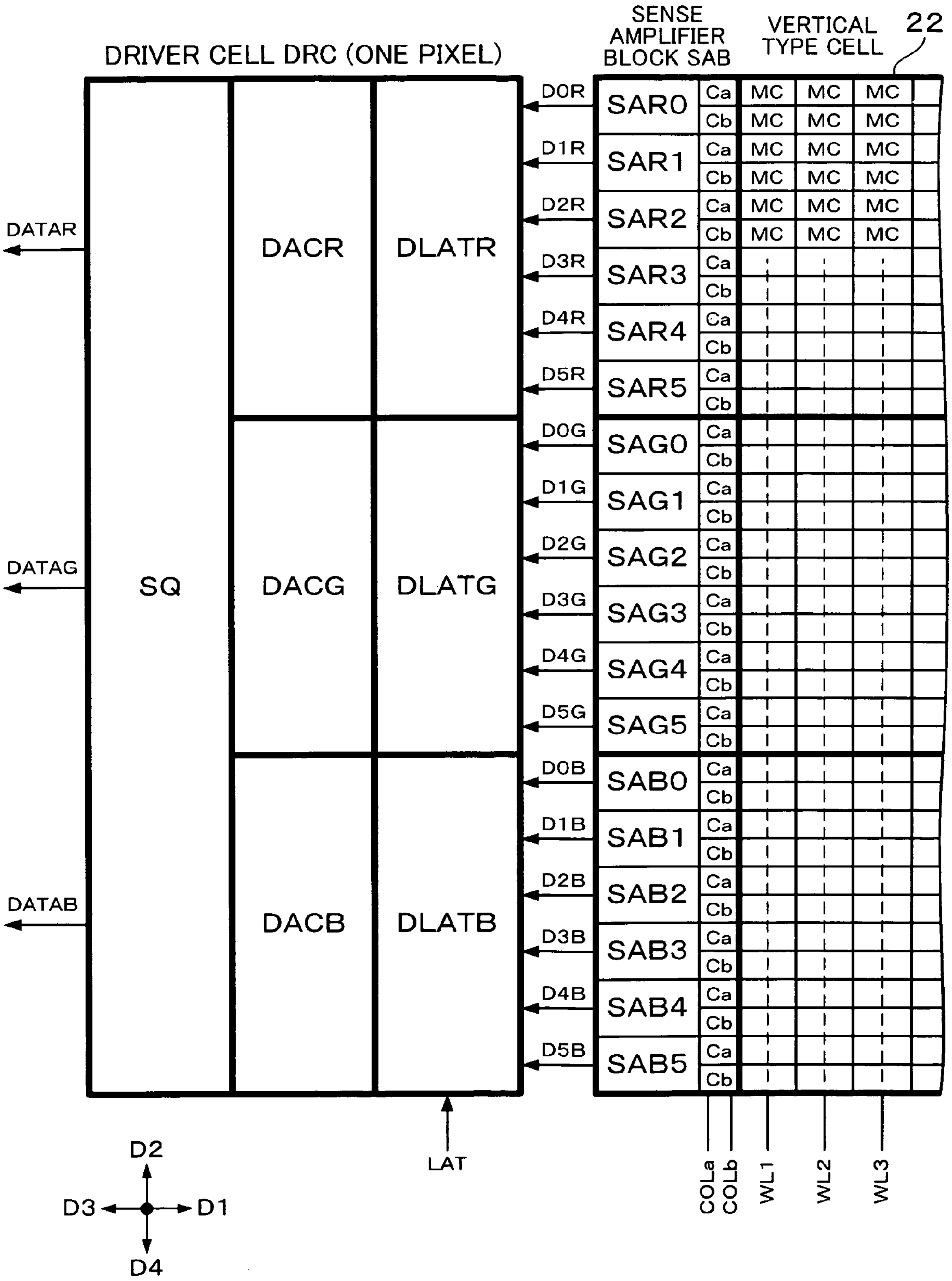
FIG. 21 is an arrangement example of the memory block and the driver cell

FIG. 21 shows an arrangement example of the memory block and the driver cell when using the vertical type cell shown in FIG. 19C as the memory cell. The width of the vertical type cell in the direction D2 can be reduced in comparison with the horizontal type cell. Therefore, the number of memory cells in the direction D2 can be doubled in comparison with the horizontal type cell. When using the vertical type cell, the column of the memory cells connected with each sense amplifier is switched by using column select signals COLa and COLb.

In FIG. 21, when the column select signal COLa goes active, the column Ca side memory cells MC provided on the D1 side of the sense amplifiers SAR0 to SAR5 are selected and connected with the sense amplifiers SAR0 to SAR5, for example. The signals of the image data stored in the selected memory cells MC are amplified and output as the image data D0R to D5R. When the column select signal COLb goes active, the column Cb side memory cells MC provided on the D1 side of the sense amplifiers SAR0 to SAR5 are selected and connected with the sense amplifiers SAR0 to SAR5. The signals of the image data stored in the selected memory cells MC are amplified and output as the image data D0R to D5R. The above description also applies to the read operation of image data from the memory cells connected with the remaining sense amplifiers.

In the configuration shown in FIG. 21, the image data can be read a plurality of times in one horizontal scan period shown in FIG. 17 as described below. Specifically, in the first horizontal scan period, the first image data is read by selecting the wordline WL1 and setting the column select signal COLa to active, and the first data signal DATAa is output as indicated by A5 shown in FIG. 17. In the first horizontal scan period, the second image data is read by again selecting the wordline WL1 and setting the column select signal COLb to active, and the second data signal DATAb is output as indicated by A6 shown in FIG. 17. In the second horizontal scan period, the first image data is read by selecting the wordline WL2 and setting the column select signal COLa to active, and the first data signal DATAa is output. In the second horizontal scan period, the second image data is read by again selecting the wordline WL2 and setting the column select signal COLb to active, and the second data signal DATAb is output. When using the vertical type cell, the image data can be read a plurality of times in one horizontal scan period by selecting a single wordline in the memory block a plurality of times in one horizontal scan period.

The configuration and the arrangement of the driver cell DRC are not limited to those shown in FIGS. 20 and 21. Various modifications and variations may be made. For example, when a low-temperature polysilicon TFT display driver or the like multiplexes and supplies R, G, and B data signals to the display panel as shown in FIG. 10C, R, G, and B image data (image data for one pixel) may be D/A converted by using one common DAC. In this case, it suffices that the driver cell DRC include one common DAC having the configuration shown in FIG. 10A. In FIGS. 20 and 21, the R circuits (DLATR and DACR), the G circuits (DLATG and DACG), and the B circuits (DLATB and DACB) are disposed along the direction D2 (D4). However, the R, G, and B circuits may be disposed along the direction D1 (D3).

5.5 Arrangement of Grayscale Voltage Output Line and Shielding of Bitline

Figure 22A:
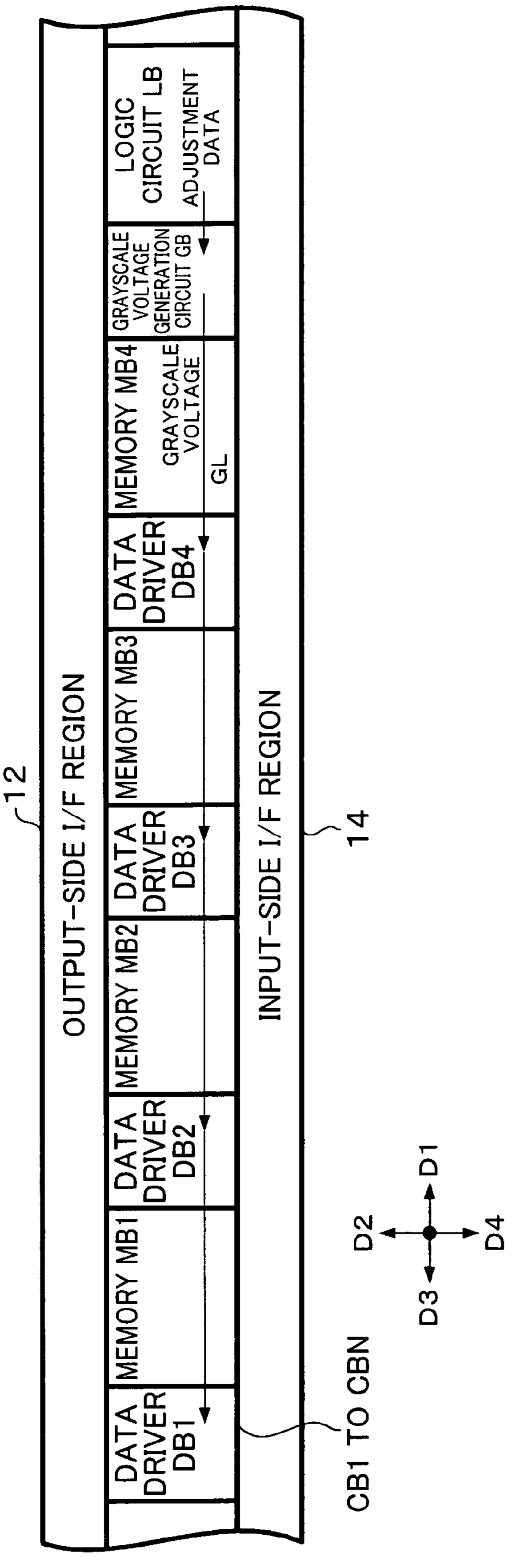
FIGS. 22A to 22C are diagrams illustrative of an arrangement method for a grayscale voltage output line.

In the embodiment, as shown in FIG. 22A, grayscale voltage output lines to which the grayscale voltages from the grayscale voltage generation circuit block GB are output are disposed above the circuit blocks CB1 to CBN along the direction D1. In more detail, the grayscale voltage output line is formed by a global line GL provided in the upper layer of the local line in the circuit block.

Specifically, the grayscale voltages from the grayscale voltage generation circuit block GB must be supplied to the data driver blocks DB1 to DB4 arranged along the direction D1, as shown in FIG. 22A. If the grayscale voltage output lines are disposed in the I/F regions 12 and 14, it becomes difficult to dispose other signal lines and power supply lines in the VF regions 12 and 14 by using the global lines. Therefore, since the interconnect efficiency in the I/F regions 12 and 14 is decreased, the widths of the I/F regions 12 and 14 in the direction D2 must be increased. In particular, since it is necessary to dispose many data signal output lines from the data driver block and many scan signal output lines from the scan driver blocks in the output-side I/F region 12, it is not desirable to dispose the grayscale voltage output lines in the output-side I/F region 12.

In FIG. 22A, the grayscale voltage output lines from the grayscale voltage generation circuit block GB are disposed on the circuit blocks CB1 to CBN along the direction D1. Therefore, the global lines of the I/F regions 12 and 14 can be used as signal lines and power supply lines other than the grayscale voltage output line, whereby the interconnect efficiency can be increased.

Figure 22B:
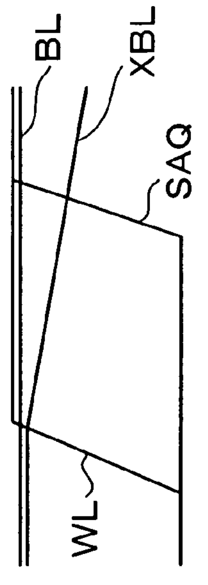

However, the following problem may occur if the global line GL such as the grayscale voltage output line is disposed on the memory blocks MB1 to MB4. In FIG. 22B, when the wordline WL is set to active and the voltage level of the bitline BL becomes higher than the voltage level of the bitline XBL, the output SAQ of the sense amplifier outputs normal logic "1".

Figure 22C:
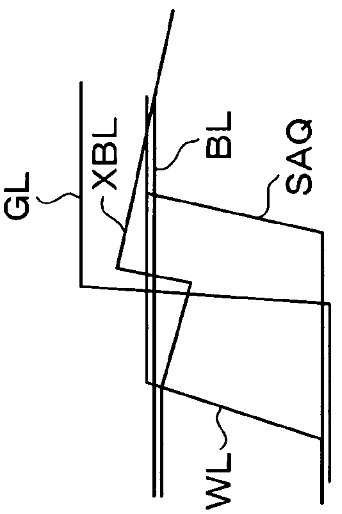

In FIG. 22C, when the voltage level of the global line GL is changed, the voltage level of the bitline XBL is changed by capacitive coupling between the global line GL and the bitline XBL in the lower layer. This may cause the output SAQ of the sense amplifier to output abnormal logic "0".

In the embodiment, a shield line is provided in the upper layer of the bitline in the memory blocks MB1 to MB4 shown in FIG. 22A, and the grayscale voltage output line from the grayscale voltage generation circuit block GB is provided in the upper layer of the shield line.

FIG. 23A shows an arrangement example of a shield line SDL when using the horizontal type cell. In FIG. 23A, a first metal interconnect ME1 in the lowermost layer is used for node connection, and a second metal interconnect ME2 in the upper layer is used as the bitlines BL and XBL and the VDD (second power supply in a broad sense) power supply line. A third metal interconnect ME3 is used as the wordline WL and the VSS (first power supply in a broad sense) power supply line, and a fourth metal interconnect ME4 is used as the shield line SDL connected with the power supply VSS. A fifth metal interconnect ME5 in the uppermost layer is used as the global line GL such as the grayscale voltage output line.

FIG. 23B shows an arrangement example of the shield line SDL when using the vertical type cell. In FIG. 23B, the metal interconnect ME1 is used for node connection, and the metal interconnect ME2 is used as the wordline WL and the VDD power supply line. The third metal interconnect ME3 is used as the bitlines BL and XBL and the VSS power supply line, and the fourth metal interconnect ME4 is used as the shield line SDL. The metal interconnect ME5 is used as the global line GL such as the grayscale voltage output line.

In FIGS. 23A and 23B, the bitlines BL and XBL are disposed along the direction D1 (long side direction of the integrated circuit device), and the shield line SDL is disposed along the direction D1 so that the shield line SDL overlaps the bitlines BL and XBL. Specifically, the shield line SDL is formed in the upper layer of the bitlines BL and XBL so as cover the bitlines BL and XBL.

This prevents a change in the voltage level of the global line GL such as the grayscale voltage output line from being applied to the bitlines BL and XBL due to capacitive coupling. Therefore, a problem in which the voltage levels of the bitlines BL and XBL are changed as shown in FIG. 22C so that the sense amplifier outputs incorrect logic can be prevented.

The shield line SDL is not formed all over each memory cell but a slit is formed between the shield lines by disposing the shield line SDL in each memory cell as shown in FIGS. 23A and 23B. Gas between the metal layer and the insulating film can be removed by forming such a slit, whereby the reliability and yield can be increased.

In FIG. 23B, the VSS power supply line is disposed at a position of the slit between adjacent shield lines SDL. Therefore, shielding in the vertical direction can be realized by the shield line SDL and shielding in the horizontal direction can be realized by the VSS power supply line, whereby effective shielding can be achieved.

6. Electronic Instrument

Figure 24A:
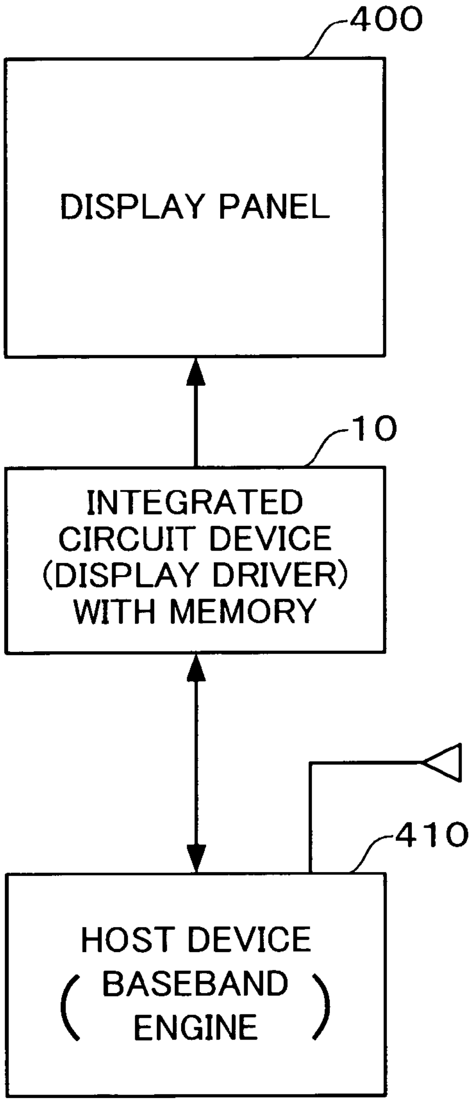
FIGS. 24A and 24B are configuration examples of an electronic instrument according to one embodiment of the invention.
Figure 24B:
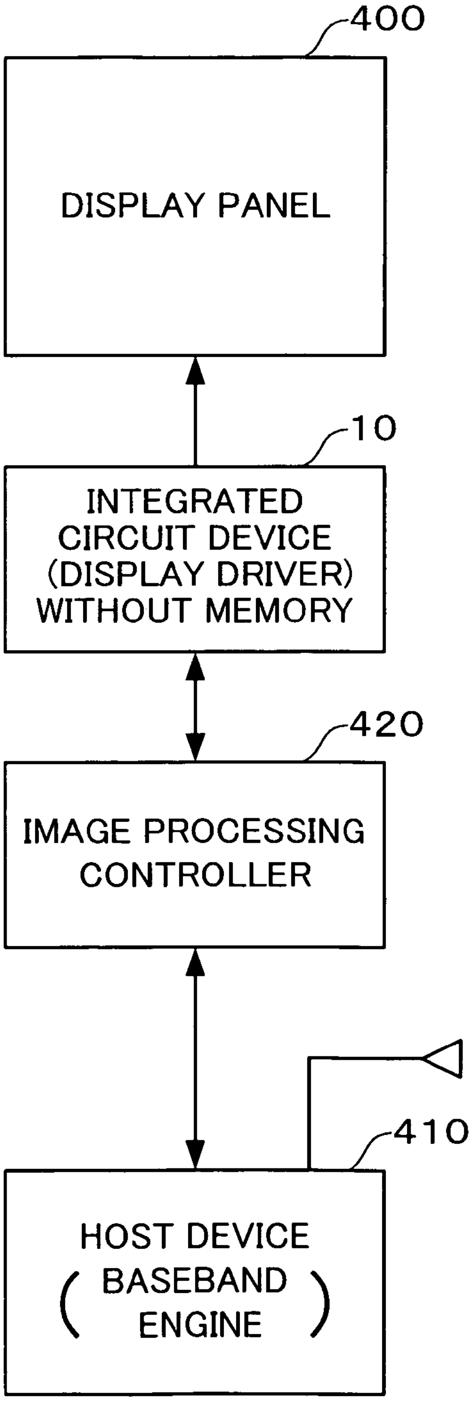

FIGS. 24A and 24B show examples of an electronic instrument (electro-optical device) including the integrated circuit device 10 of the embodiment. The electronic instrument may include constituent elements (e.g. camera, operation section, or power supply) other than the constituent elements shown in FIGS. 24A and 24B. The electronic instrument of the embodiment is not limited to a portable telephone, and may be a digital camera, PDA, electronic notebook, electronic dictionary, projector, rear-projection television, portable information terminal, or the like.

In FIGS. 24A and 24B, a host device 410 is a microprocessor unit (MPU), a baseband engine (baseband processor), or the like. The host device 410 controls the integrated circuit device 10 as a display driver. The host device 410 may perform processing as an application engine and a baseband engine or processing as a graphic engine such as compression, decompression, or sizing. An image processing controller (display controller) 420 shown in FIG. 24B performs processing as a graphic engine such as compression, decompression, or sizing instead of the host device 410.

A display panel 400 includes a plurality of data lines (source lines), a plurality of scan lines (gate lines), and a plurality of pixels specified by the data lines and the scan lines. A display operation is realized by changing the optical properties of an electro-optical element (liquid crystal element in a narrow sense) in each pixel region. The display panel 400 may be formed by an active matrix type panel using switch elements such as a TFT or TFD. The display panel 400 may be a panel other than an active matrix type panel, or may be a panel other than a liquid crystal panel.

In FIG. 24A, the integrated circuit device 10 may include a memory. In this case, the integrated circuit device 10 writes image data from the host device 410 into the built-in memory, and reads the written image data from the built-in memory to drive the display panel. In FIG. 24B, the integrated circuit device 10 may not include a memory. In this case, image data from the host device 410 is written into a memory provided in the image processing controller 420. The integrated circuit device 10 drives the display panel 400 under control of the image processing controller 420.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention. For example, any term (such as the output-side I/F region and the input-side I/F region) cited with a different term having broader or the same meaning (such as the first interface region and the second interface region) at least once in this specification or drawings can be replaced by the different term in any place in this specification and drawings. The configuration, arrangement, and operation of the integrated circuit device and the electronic instrument are not limited to those described in the embodiment. Various modifications and variations may be made.

What is claimed is:

1. An integrated circuit device, comprising:

first to Nth circuit blocks (N is an integer larger than one) disposed on a surface of the integrated circuit device along a first direction, when the first direction is a direction from a first side of the integrated circuit device toward a third side that is opposite to the first side, and when a second direction is a direction from a second side of the integrated circuit device toward a fourth side that is opposite to the second side, the second side being longer than the first side, the first to Nth circuit blocks including:

a logic circuit block that sets adjustment data for adjusting grayscale characteristic;

a grayscale voltage generation circuit block that generates grayscale voltages based on the adjustment data for adjusting grayscale characteristic;

at least one data driver block that receives the grayscale voltages from the grayscale voltage generation circuit block and drives data lines; and a power supply circuit block that generates a power supply voltage;

the at least one data driver block being disposed on the surface of the integrated circuit device between the logic circuit block and the grayscale voltage generation circuit block, and the power supply circuit block, and the logic circuit block supplying the adjustment data for adjusting grayscale characteristic to the grayscale voltage generation circuit block.

2. The integrated circuit device as defined in claim 1, the logic circuit block and the grayscale voltage generation circuit block being disposed on the surface of the integrated circuit device adjacent to each other along the first direction.

3. The integrated circuit device as defined in claim 1, the grayscale voltage generation circuit block being disposed on the surface of the integrated circuit device between the at least one data driver block and the logic circuit block.

4. The integrated circuit device as defined in claim 2, the grayscale voltage generation circuit block being disposed on the surface of the integrated circuit device between the at least one data driver block and the logic circuit block.

5. The integrated circuit device as defined in claim 1, the first to Nth circuit blocks including at least one memory block that stores image data, and the at least one memory block and the at least one data driver block being disposed on the surface of the integrated circuit device adjacent to each other along the first direction.

6. The integrated circuit device as defined in claim 5, the first to Nth circuit blocks including:

first to Ith memory blocks (I is an integer larger than one) as the at least one memory block; and first to Ith data driver blocks as the at least one data driver block, each of the first to Ith data driver blocks being disposed on the surface of the integrated circuit device adjacent to a corresponding memory block among the first to Ith memory blocks along the first direction.

7. The integrated circuit device as defined in claim 1, the grayscale voltage generation circuit block including:

a select voltage generation circuit that outputs select voltages based on the power supply voltage; and a grayscale voltage select circuit that selects and outputs the grayscale voltages based on the select voltages and the adjustment data set by the logic circuit block.

8. The integrated circuit device as defined in claim 7, the select voltage generation circuit being disposed on the surface of the integrated circuit device on the second direction side of the grayscale voltage select circuit or on a fourth direction side of the grayscale voltage select circuit, the fourth direction being opposite to the second direction.

9. The integrated circuit device as defined in claim 7, the grayscale voltage select circuit being disposed on the surface of the integrated circuit device between the at least one data driver block and the logic circuit block.

10. The integrated circuit device as defined in claim 8, the grayscale voltage select circuit being disposed on the surface of the integrated circuit device between the at least one data driver block and the logic circuit block.

11. The integrated circuit device as defined in claim 1, grayscale voltage output lines to which the grayscale voltages are output from the grayscale voltage generation circuit block being disposed on the surface of the integrated circuit device along the first direction and above the first to Nth circuit blocks.

12. The integrated circuit device as defined in claim 1, the first to Nth circuit blocks including at least one memory block that stores image data, and in the memory block, shield lines being disposed on the surface of the integrated circuit device in a layer above bitlines, and grayscale voltage output lines to which the grayscale voltages are output from the grayscale voltage generation circuit block being disposed on the surface of the integrated circuit device in a layer above the shield lines.

13. The integrated circuit device as defined in claim 11, the first to Nth circuit blocks including at least one memory block that stores image data, and in the memory block, shield lines being disposed on the surface of the integrated circuit device in a layer above bitlines, and the grayscale voltage output lines to which the grayscale voltages are output from the grayscale voltage generation circuit block being disposed on the surface of the integrated circuit device in a layer above the shield lines.

14. The integrated circuit device as defined in claim 12, in the memory block, the bitlines being disposed on the surface of the integrated circuit device along the first direction, and the shield lines being disposed on the surface of the integrated circuit device along the first direction so that the shield lines overlaps the bitlines.

15. The integrated circuit device as defined in claim 13, in the memory block, the bitlines being disposed on the surface of the integrated circuit device along the first direction, and the shield lines being disposed on the surface of the integrated circuit device along the first direction so that the shield lines overlaps the bitlines.

16. The integrated circuit device as defined in claim 1, comprising:

a first interface region provided along the fourth side and on the second direction side of the first to Nth circuit blocks; and a second interface region provided along the second side and on a fourth direction side of the first to Nth circuit blocks, the fourth direction being opposite to the second direction.

17. An electronic instrument, comprising:

the integrated circuit device as defined in claim 1; and a display panel driven by the integrated circuit device.

18. An electronic instrument, comprising:

the integrated circuit device as defined in claim 2; and a display panel driven by the integrated circuit device.

19. An electronic instrument, comprising:

the integrated circuit device as defined in claim 3; and a display panel driven by the integrated circuit device.

20. An electronic instrument, comprising:

the integrated circuit device as defined in claim 16; and a display panel driven by the integrated circuit device.

* * * * *